United States Patent [19]

Hayashi et al.

[11] Patent Number: 5,083,185
[45] Date of Patent: Jan. 21, 1992

[54] SURGE ABSORPTION DEVICE

[75] Inventors: Yutaka Hayashi, Ibaraki; Masaaki Sato, Sagamihara; Yuji Muramatsu, Machida; Hirofumi Yoshihara, Hamuramachi; Teiji Hasegawa, Kawasaki, all of Japan

[73] Assignees: Agency of Industrial Science & Technology, Ministry of International Trade & Industry; Sankosha Corporation; Mitaka Denshi Kagaku Laboratory Inc., all of Tokyo, Japan

[21] Appl. No.: 488,457

[22] Filed: Feb. 26, 1990

Related U.S. Application Data

[63] Continuation of Ser. No. 829,516, Feb. 14, 1986, abandoned.

[30] Foreign Application Priority Data

| Feb. 15, 1985 | [JP] | Japan | 60-26498 |
| May 14, 1985 | [JP] | Japan | 60-100400 |
| Sep. 17, 1985 | [JP] | Japan | 60-203447 |
| Sep. 17, 1985 | [JP] | Japan | 60-203448 |
| Dec. 27, 1985 | [JP] | Japan | 60-292969 |

[51] Int. Cl.$^5$ .................. H01L 29/74; H01L 29/90; H01L 29/48
[52] U.S. Cl. .................. 357/38; 357/14; 357/37; 357/39; 357/64; 357/86
[58] Field of Search .......... 357/38, 86, 39, 37, 357/15, 64

[56] References Cited

U.S. PATENT DOCUMENTS

| 3,302,076 | 1/1967 | Kang | 357/13 |
| 3,328,584 | 6/1967 | Weinstein | 357/38 |
| 3,335,296 | 8/1967 | Smart | 357/38 |
| 3,427,512 | 2/1969 | Mapother | 357/13 |
| 3,566,213 | 2/1971 | Kaiser | 357/13 |
| 4,063,277 | 12/1977 | Gooen | 357/38 |
| 4,115,798 | 9/1978 | Platzoeder | 357/64 |
| 4,631,561 | 12/1986 | Foroni et al. | 357/13 |

FOREIGN PATENT DOCUMENTS

| 2431011 | 1/1975 | Fed. Rep. of Germany | 357/15 |
| 51-44069 | 11/1976 | Japan . | |
| 53-24796 | 7/1978 | Japan . | |
| 56-30708 | 7/1981 | Japan . | |
| 58-161378 | 9/1983 | Japan . | |

OTHER PUBLICATIONS

Sze, Physics of Semiconductor Devices, (Wiley, N.Y., 1981), pp. 613-619.
Thyristor-Electronics (1), Thyristor Device, by Editorial Committee, (1973, Maru-Zen K.K., Tokyo, publ.).

Primary Examiner—William D. Larkins
Attorney, Agent, or Firm—Oblon, Spivak, McClelland, Maier & Neustadt

[57] ABSTRACT

A surge absorption device includes fundamentally a first semiconductor region, a second semiconductor region forming a pn junction between itself and the first region, a third region determining the effective thickness of the second region, and a fourth region provided in contact with the first region and forming an injection junction for causing first minority carriers of a kind the same as that of minority carriers in the first region to be injected into the first region. When a depletion layer formed by application of reverse bias across the pn junction reaches the third region, a punch-through region is formed in the second region. In this state, when minority carriers are injected from the fourth region into the first region, the minority carriers are absorbed by the second region to constitute the device current.

2 Claims, 14 Drawing Sheets

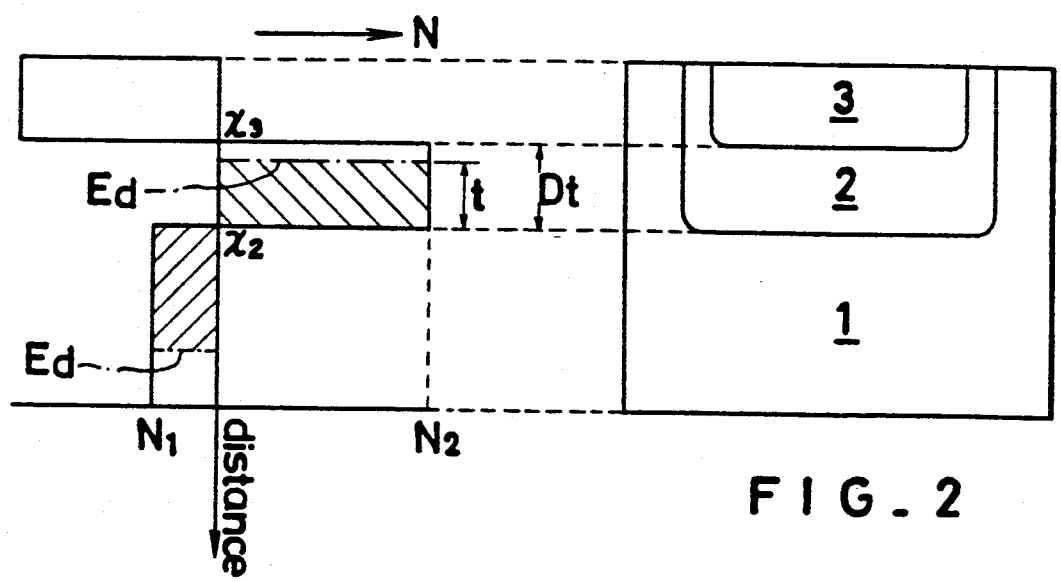
FIG_2
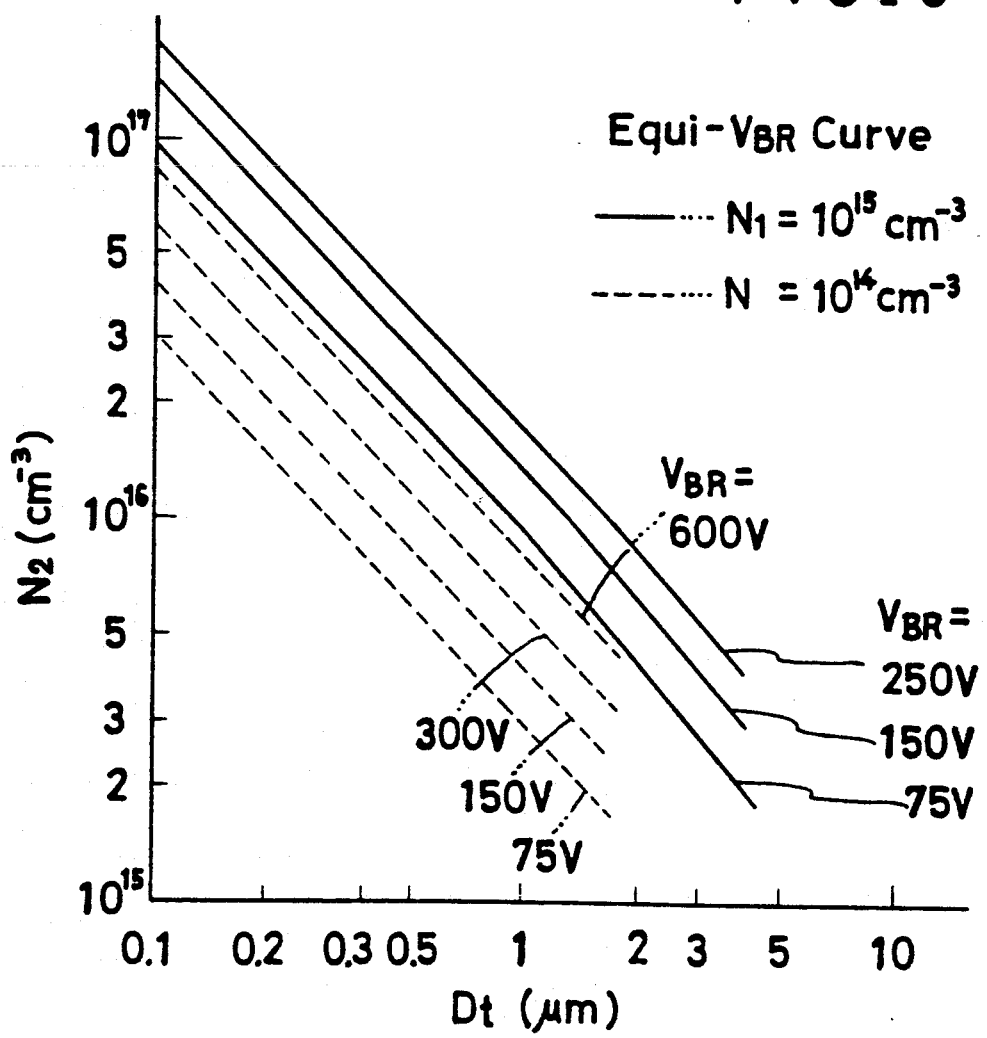
FIG_3

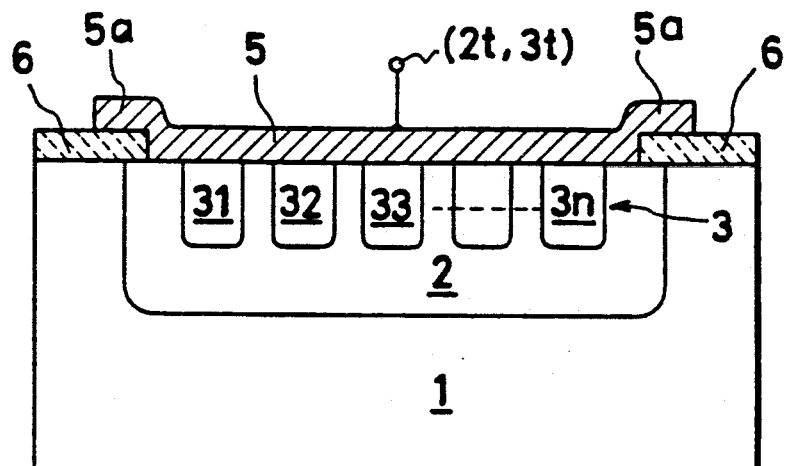
FIG_6
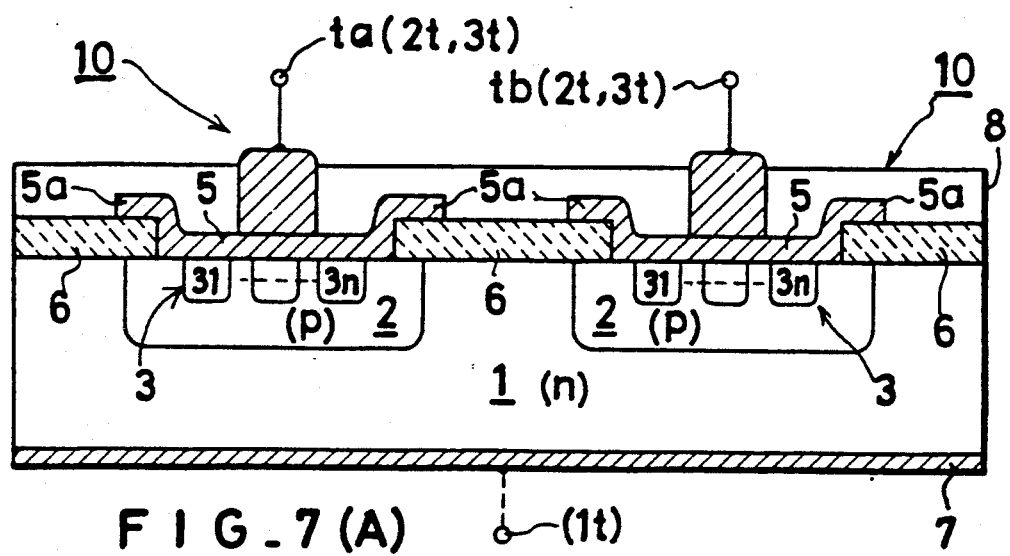
FIG_7(A)
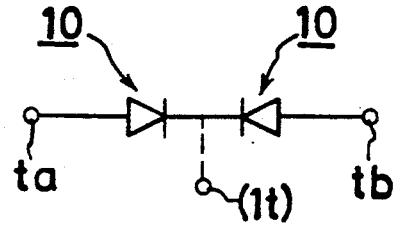
FIG_7(B)

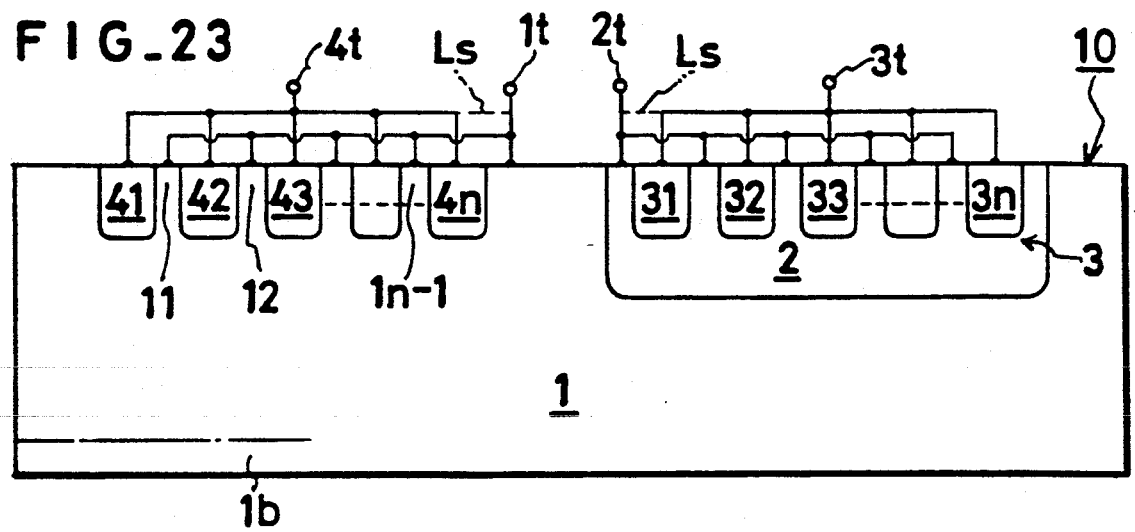
FIG_23
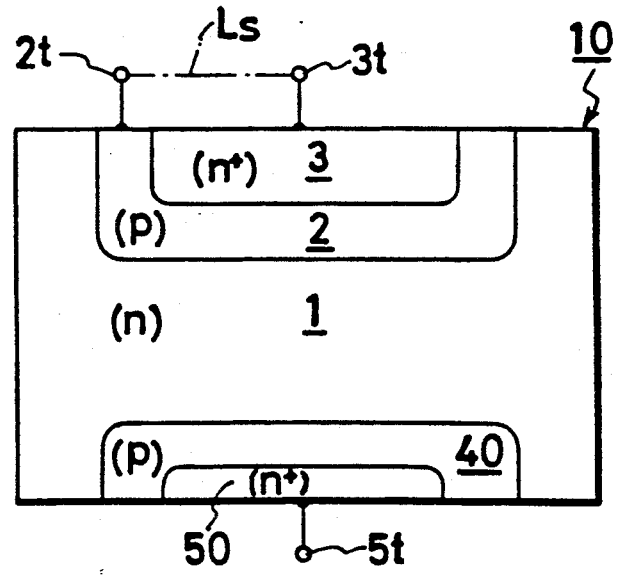
FIG_24
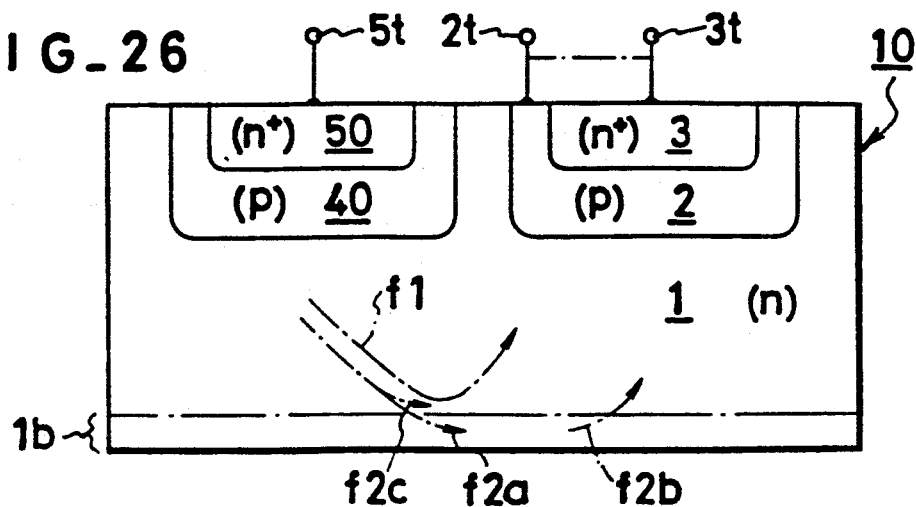
FIG_26

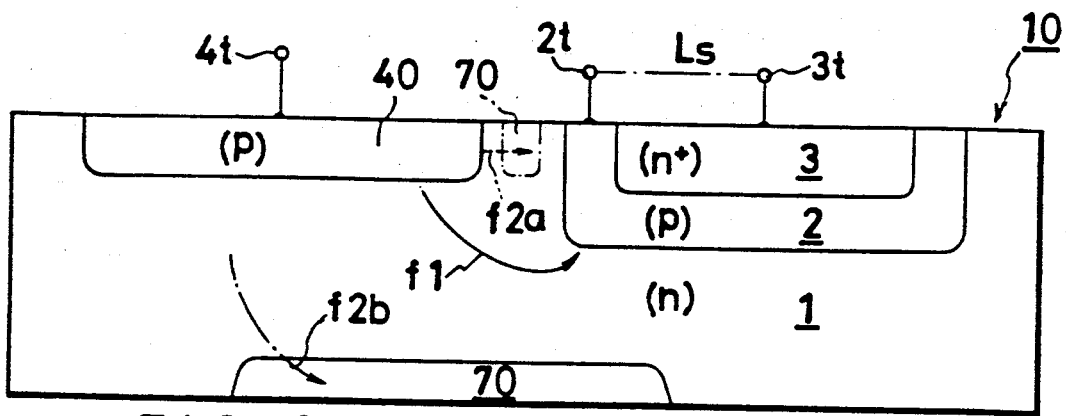
FIG_35
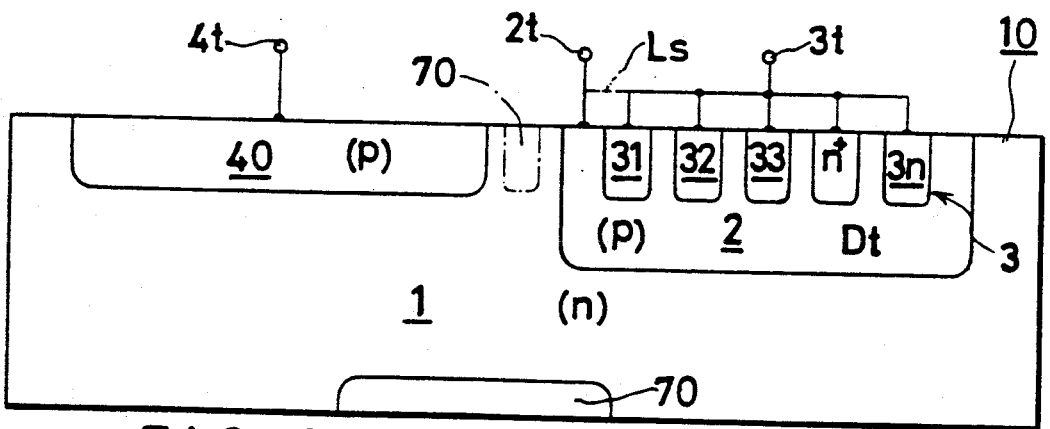
FIG_37
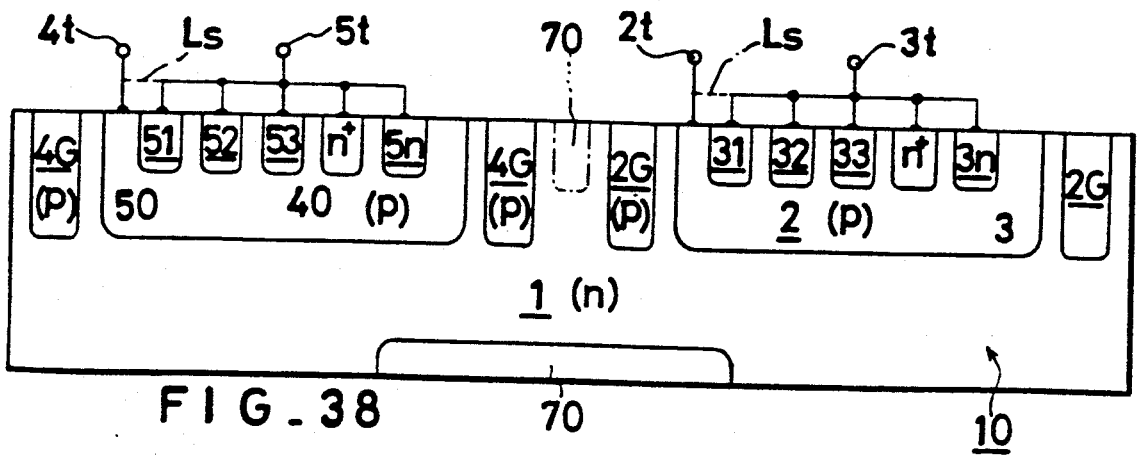
FIG_38

SURGE ABSORPTION DEVICE

This application is a continuation of application Ser. No. 06/829,516, filed on Feb. 14, 1986, now abandoned.

FIELD OF THE INVENTION AND RELATED ART STATEMENT

The present invention relates to a surge absorption device for protecting an electric circuit from abnormal voltages caused by various surge factors such as lightning and electrical switching and, more particularly, to such a surge absorption device employing the punch-through principle. This invention further relates to a method for producing such a surge absorption device.

Electronic and communication devices of various types are commonly provided with a surge absorption device, e.g. an arrestor, for absorbing (discharging) surges (voltages exceeding a prescribed level) caused by lightning, electrical switching and other surge factors. Such a surge absorption device has specific breakdown voltage characteristics and when a high voltage surge exceeding the breakdown voltage arises there is formed within the device an equivalent low impedance path through which the surge current caused by the high voltage surge is discharged. As a result, the voltage across the device terminals is held below a predetermined level so that no abnormal voltage is allowed to reach the electric circuit being protected by the surge absorption device.

Nearly all conventional surge absorption devices of this type operate on the avalanche breakdown principle. In other words, the avalanche breakdown voltage at the time a reverse bias is applied to a pn junction diode structure or to a diode connection structure in a transistor is set as the breakdown voltage of the surge absorption device. In such case, however, the avalanche breakdown voltage of the device is determined almost entirely by the impurity concentration in the one of the two semiconductor regions forming the pn junction which has the higher resistivity (generally the region constituted by the semiconductor substrate). In the conventional avalanche breakdown type surge absorption device, therefore, it is impossible, or at least very difficult, to freely vary the breakdown voltage so long as a semiconductor substrate of a given fixed impurity concentration is used. Thus in order to obtain devices having different breakdown voltages it has been necessary to use semiconductor substrates with different impurity concentrations.

The need to use different semiconductor substrates is extremely inconvenient and also entails the problem that changing the breakdown voltage also causes changes in such other electrical characteristics as the junction capacitance and series resistance. This means that the device cannot be designed independently for only the breakdown voltage without also taking into consideration the junction capacitance and series resistance.

Moreover, the conventional avalanche breakdown type surge absorption device is frequently subject to structural limitations. This is because in this type of surge absorption device when the second semiconductor region of a predetermined shape is formed on or in the surface of the first semiconductor region by diffusing impurity within the first semiconductor region, abalanche breakdown generally occurs most readily at the portions of high electric field concentration at the peripheral edge corner or corners of the predetermined shape of the junction between the two regions. When this situation arises, it becomes very difficult to obtain uniform flow of current over the full area of the junction during clamping of the input voltage following breakdown.

To avoid this problem, it has been the practice to eliminate corner rounding of the junction by, for example, an abrading or etching operation, much in the manner used for mesa type transistors. However, this countermeasure impairs productivity and hinders the integration of a plurality of devices on a single chip.

OBJECT AND SUMMARY OF THE INVENTION

An object of the present invention is to provide a surge absorption device which is capable of effectively absorbing large surges and which operates not on the avalanche breakdown principle but on the punch-though principle, and a method for producing the same.

Another object of the present invention is to provide a surge absorption device whose breakdown voltage can be readily set with a high degree of design freedom over a wide range of values independently of the impurity concentration, resistivity, thickness etc. of the semiconductor substrate, and a method for producing the same.

Another object of the present invention is to provide a surge absorption device whose junction capacitance, series resistance and other electric characteristics can be set independently of the prescribed breakdown voltage thereof, and a method for producing the same.

Another object of the invention is to provide a surge absorption device which can be easily integrated at high density without need for edge treatment or other difficult processing steps, and a method for producing the same.

Another object of the invention is to provide a punch-through type surge absorption device wherein the clamp voltage during surge current absorption can be set considerably lower than the breakdown voltage so as to enable discharge of larger currents, and a method for producing the same.

Another object of the invention is to provide a punch-through type surge absorption device wherein the clamp voltage during surge current absorption can be set at a predetermined level for preventing the occurrence of follow current but otherwise allowing an external current to continuously flow from a system to be protected and enabling quick return to the turn-off state when the surge current subsides, and a method for producing the same.

Another object of the invention is to provide a punch-through type surge absorption device having a holding current larger than the current supplied from an electric power source of a system to be protected during normal operation, whereby the continuous flow of the current into the device of the present invention from the electric power source of the system is prevented, and a method for producing the same.

The present invention attains the aforesaid objects by providing a surge absorption device comprising a first semiconductor region defined in one portion of a semiconductor substrate and exhibiting conductivity of one type, a second semiconductor region formed in the surface of the semiconductor substrate and exhibiting conductivity of the type opposite to that of the first semiconductor region, the second semiconductor region forming a pn junction with the first semiconductor region, and at least one third region formed in the second semiconductor region and determining the effective thickness of the second semiconductor region, the third region forming a junction with the second semiconductor region.

The present invention further attains the aforesaid objects by providing a method for producing a surge absorption device comprising the steps of forming, in the surface of a semiconductor substrate exhibiting conductivity of one type and constituting a first semiconductor region, a second semiconductor region exhibiting conductivity of the type opposite to that of the first semiconductor region, and forming in the surface of the second semiconductor region at least one third region, thereby determining the effective thickness of the second semiconductor region in terms of the separation between the first and third regions.

In the surge absorption device of the foregoing structure, when a reverse bias is applied across the pn junction formed between the first and second semiconductor regions, a depletion layer is formed on both sides of the junction. When the device is subjected to an abnormally high voltage, i.e. a surge voltage, the depletion layer in the second semiconductor region reaches the third region, creating a punch-through condition that enables discharge of the surge current. Since the surface of the second semiconductor region in which the depletion layer giving rise to the punch-through state can be formed to a desired height from one side of the semiconductor substrate and the third region can be formed on the second region, the breakdown voltage can be easily controlled to the desired value.

In particular, when the third semiconductor region is formed using impurity diffusion or epitaxial growth techniques, it become possible to control the thickness of the second semiconductor region with high precision.

Moreover, if a fourth region of a semiconductor or electrically conductive material constituting an injection junction with the first semiconductor region is formed on the opposite side of the first semiconductor region from that formed with the second semiconductor regions or in the first surface of the first semiconductor region spaced apart from the second semiconductor region, the structure becomes such that first minority carriers of the same conductivity type as that of minority carriers in the first region can be injected into the first semiconductor regions from the fourth region, whereby injection of minority carriers from the fourth region to the first semiconductor region occurs, becoming majority carriers in the second semiconductor region and giving rise to a voltage drop on entry into the second semiconductor region and then forward bias between the third region and the second semiconductor region, so that when the third region forms an injection junction with the second semiconductor region, injection of second minority carriers of the conductivity type opposite to that of the second semiconductor region from the third region to the second semiconductor region is carried out. In this state, when a surge current of greater than the breakover voltage arises, the clamp voltage across the device terminals becomes extremely low because of positive feedback.

Further, a fifth region of a semiconductor or electrically conductive material can be formed in the fourth semiconductor region to form a rectifying junction therewith. The device according to this structure, while exhibiting the functions provided by the device with the first to fourth regions, further enables the clamp voltage to be freely set by the avalanche breakdown voltage, Zener voltage or punch-through voltage between the fourth and fifth semiconductor regions, making it possible to set the clamp voltage at such value that follow current (continuous current flow from an electric power source of a system to be protected) does not arise after discharge of the surge current.

Alternatively, the fourth injecting region can be provided on the same side of the first semiconductor region as that on which the second semiconductor region is formed, as laterally spaced from the second semiconductor region, and at least one portion of the first or second surface of the first semiconductor region between the second semiconductor and fourth regions, or the second surface of the first semiconductor region beneath the bottom of the second semiconductor region or the bottom of the fourth injecting region can be provided with a recombination region by introducing lattice defects, doping with an impurity to form a deep recombination center or furnishing a Schottky barrier, whereby follow current can be prevented by controlling the holding current to a larger value than the current flowing from an electric power supply in the apparatus being protected.

The other objects and features of the invention will clear from the following detailed explanation made with reference to the drawings.

BRIEF DESCRIPTION OF THE DRAWINGS

FIG. 2 is a schematic illustration of impurity concentration distribution for explaining the operating principle of the invention.

FIG. 3 is a graph showing the relationship between the thickness of the second semiconductor region and the impurity concentration distribution in the device of FIG. 2.

FIG. 6 is a schematic illustration of the structure of a fourth embodiment of the device according to the invention.

FIGS. 7(A) and 7(B) are a schematic illustration of the structure of a fifth embodiment of the device according to the invention and a diagram of an equivalent circuit thereof.

FIG. 23 is a schematic illustration of the structure of a seventeenth embodiment according to the invention.

FIG. 24 is a schematic illustration of the structure of an eighteenth embodiment according to the invention.

FIG. 26 is a schematic illustration of the structure of a nineteenth embodiment according to the invention.

FIG. 35 is a schematic illustration of the structure of a twenty-eighth embodiment according to the invention.

FIG. 37 is a schematic illustration of the structure of a twenty-ninth embodiment according to the invention.

FIG. 38 is a schematic illustration of the structure of a thirtieth embodiment according to the invention.

DETAILED DESCRIPTION OF THE PREFERRED EMBODIMENTS

The present invention relates to a surge absorption device which utilizes the punch-through principle, which is completely different from the avalanche breakdown principle utilized by certain types of conventional surge absorption devices. This punch-through principle and the basic structure of the device according to this invention will now be explained with reference to FIG. 1.

Figure 1:
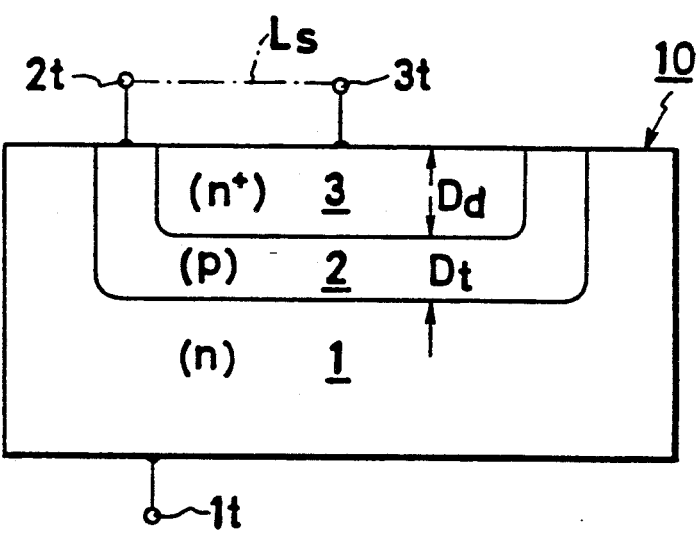
FIG. 1 is a schematic illustration of a first embodiment having the basic structure of the device according to this invention.

The first embodiment of the surge absorption device is denoted by reference numeral 10 in FIG. 1 and comprises a first semiconductor region 1 constituted of a semiconductor material exhibiting conductivity of one type, a second semiconductor region 2 formed on or within the first semiconductor region 1 and exhibiting conductivity of a type opposite from that of the first semiconductor region, and a third region 3 formed within the second semiconductor region 2 in noncontacting relation to the first semiconductor region 1 and exhibiting conductivity of the same type as the first semiconductor region 1, the junction between the second semiconductor region 2 and the first semiconductor region 1 and that between the second semiconductor region 2 and the third region 3 having opposite rectification characteristics. Generally the region 3 is formed of non semiconductor material having electric conductivity. Namely, the region 3 may be formed of metal, metal silicide or any other material. Therefore, when a surge voltage is applied across the first and third regions 1 and 3, a depletion layer is formed at the junction between the regions 1 and 3. When the surge voltage becomes abnormally high, the depletion layer expands throughout the portion of the second region defined between the regions 1 and 3 giving rise to punch-through, so that the surge current is discharged via the punch-through path.

The breakdown voltage of the surge absorption device of this structure is determined by the electrical properties of the second semiconductor region 2 in which the depletion layer forms, such as by the impurity concentration of the second semiconductor region 2 and the thickness of the second semiconductor region 2 between the regions 1 and 3.

The device of the aforesaid structure can be easily produced by the method of diffusing impurity into the top and bottom surfaces of a semiconductor substrate exhibiting conductivity of one type so as to form two diffused regions exhibiting conductivity of the opposite type, whereby junctions exhibiting mutually opposite rectification characteristics are formed between the substrate region and the respective diffused regions of opposite conductivity type from the substrate region. In this case, the diffused region on the bottom surface corresponds to the first semiconductor region 1 in FIG. 1, the diffused region on the top surface corresponds to the third semiconductor region 3 and the undiffused region remaining therebetween corresponds to the second semiconductor region 2.

However, when the aforesaid method involving the diffusion of impurity from the top and bottom surfaces is used for the formation of the device according to this invention, the following problem arises. As was stated earlier, the breakdown voltage of the device is determined by the impurity concentration of the intermediate second semiconductor region 2, but when the aforesaid method is used the properties of this region are not affected by the diffusion of impurity from the top and bottom surfaces, meaning that it is not possible to control the region's electrical characteristics. In other words, similarly to the case of the conventional avalanche breakdown type surge absorption device, it is impossible to carry out control for compensating for wafer-to-wafer variation in preprocessing impurity concentration affecting the breakdown voltage.

Further, the method of diffusing impurity from the top and bottom surfaces involves difficulties in fabrication from the structural point of view. This is because even the thinnest of the wafers used as the semiconductor substrate generally has a thickness of between 200 μm and 300 μm, whereas the thickness permissible for the intermediate region if it is to provide punch-through is only a few μm and at the very maximum no more than ten or so μm. In order to provide such a thin intermediate region in a substrate of the aforesaid thickness with high precision, therefore, it is necessary to diffuse impurity into the top and bottom surfaces of the substrate to a depth on the order of 100 μm while leaving an undiffused intervening region measuring only a few microns. Technically, this is very difficult.

One conceivable method for overcoming this difficulty would be to first etch the wafer to an appropriate thickness and then diffuse impurities from the top and bottom surfaces to obtain the required structure. This method is, however, not practical since even if the technology for etching away the major part of the wafer thickness should be available, the resulting etched wafer would be so deficient in strength that it would not be able to stand up to the ensuing impurity diffusion processing. What is more, even if this problem should be overcome, the brittleness of the substrate would be further increased by the diffusion of impurity, making the device unsuitable for practical application and precluding the possibility of integrating it on a single chip with other like devices.

The disadvantages of the device fabricated by the diffusion of impurities from the top and bottom surfaces as described in the foregoing can be overcome by the method of the present invention described below.

In accordance with the method of the present invention, the surge absorption device 10 constituted of the first and second semiconductor regions 1, 2 and the third region 3 is formed by defining one portion (bottom portion) of a substrate of a semiconductor material exhibiting one conductivity type as the first semiconductor region 1, forming the second semiconductor region 2 by diffusing into the top surface of the substrate an impurity of the opposite conductivity type from that of the substrate, and forming the third region 3 within the second semiconductor region 2 by diffusing into a part of the second semiconductor region 2 an impurity of the same conductivity type as that of the first semiconductor region 1.

For example, when the semiconductor substrate and accordingly the first semiconductor region 1 are constituted of n-type semiconductor, the second semiconductor region 2 is formed as a p-type semiconductor region by using an appropriate diffusion technique to diffuse an appropriate impurity such as boron into thee substrate. The only requirement of the third region 3 is that it be able to form one end of the main current path when punch-through occurs. It should thus preferably have high conductivity and while it may therefore be formed of a metallic or silicide region without making the rectifying junction with the second semiconductor region. In this embodiment it is formed within the second semiconductor region 2 as a high-concentration n-type (n+ type region) by double diffusion of impurity. In actual practice, the third region can be obtained by high-concentration diffusion of phosphorus.

The device is then completed by providing each of the regions with an ohmic lead. In this case, the lead terminal 2t of the second semiconductor region 2 and the lead terminal 3t of the third region 3 can, as shown by the path Ls shown by the phantom line in FIG. 1, be short-circuited on the surfaces of these regions 2, 3 at the time of fabrication. Otherwise, the leads can be led to the exterior of the chip and be short-circuited or have a bias source inserted therebetween in the peripheral circuitry.

Here the operation will be explained as regards the case where the terminals 2t and 3t are short-circuited as indicated by the line Ls and a surge voltage is applied between these short-circuited terminals on the one hand and a lead terminal provided on the first semiconductor region 1 on the other.

The line Ls can be provided on the exposed surfaces of the second and third regions 2 and 3 by depositing thereon a continuous metallic layer or the like which makes equal ohmic contact with the two regions.

Further, in order to reduce the electrical resistance of the main current path following punch-through, a region of the first semiconductor region 1 in the vicinity of the terminal 1t can be doped with a high-concentration of phosphorus so as to provide a local layer of few μm in the thickness (not shown) and of high impurity concentration.

In the surge absorption device 10 of this type, when a reverse bias is applied across the pn junction between the first semiconductor region 1 and the second semiconductor region 2, the resulting depletion layer is not only present at the first semiconductor region 1 but also extends toward the third region 3.

Therefore, when a surge voltage comes to be applied between the terminals 2t, 3t on one side and the terminal 1t on the other, since the surge voltage is applied in the phase of a reverse bias across said pn junction and is of large magnitude, it is possible for the upper edge of the depletion layer to reach the third region 3.

This state is tantamount to a punch-through state between the first semiconductor region 1 and the third region 3 and is a state of low impedance permitting the flow of a large current, meaning that it is the breakdown state of the present surge absorption device.

Once this breakdown state has occurred, the voltage between the terminals 2t, 3t and the terminal 1t is clamped at a prescribed fixed value, so that the surge absorption device 10 fulfills its surge absorption and circuit protection functions.

As a consequence, in designing the surge absorption device 10 the breakdown voltage thereof can be freely selected over a considerably broad range by controlling the punch-through voltage not only through the selection of the resistivity or impurity concentration of the first semiconductor region 1 but also through the selection of the effective thickness of the second semiconductor region 2 which is determined by the separation between the first semiconductor region 1 and the third region 3. Experiments carried out by the inventors have in fact shown that the range of selectable breakdown voltage extends from only a few volts up to several hundred volts.

In the case of the embodiment shown in FIG. 1, the second semiconductor region 2 and the third region 3 are formed by use of double diffusion carried out with respect to the semiconductor substrate 1. In such case, the effective thickness $D_t$ of the second semiconductor region 2 is directly controlled by controlling the diffusion depth $D_d$ of the impurity for the formation of the third region 3 diffused from the surface of the second semiconductor region 2. In other words, when double diffusion is used, change or modification of the height of the third region 3 with respect to the first semiconductor region 1 changes the effective thickness Dt of the second semiconductor region 2.

On the other hand, when the second semiconductor region 2 and the third region 3 are formed by an epitaxial growth technique, the effective thickness Dt of the second semiconductor region 2 is in general determined by the thickness of the grown film itself as a function of the various conditions in epitaxy, but this does not change the fact that as an actual practical matter it is the presence of the third region 3 which determines the effective thickness Dt.

As the effective thickness Dt of the second semiconductor region 2 can be controlled with high precision using conventional technology regardless of whether this region is formed by a diffusion method or an epitaxial method, in fabricating the surge absorption device according to this invention the breakdown voltage can be controlled to the desired value with high precision regardless of which method is employed.

Similarly, the impurity concentration of the second semiconductor region 2, which is also a factor determining the punch-through voltage and accordingly the breakdown voltage of the present device, can also be adjusted and/or controlled with high precision using conventional techniques.

The foregoing further means that in the case of the device according to the present invention a wide degree of designing latitude is available as regards the breakdown voltage since this voltage is a function of two independently controllable variables, namely, the effective thickness Dt of the second semiconductor region 2 and the impurity concentration of the same, both of which can be varied over wide ranges. Therefore, by using only one or the other of these two variables or by using both in appropriately controlled relation, it is possible not only to vary the breakdown voltage over a wide range of values but also to determine such other electrical characteristics as the junction capacitance and series resistance independently of breakdown voltage.

Taking a closer look at how the breakdown voltage of the device according to the present invention is related to the impurity concentration and effective thickness Dt of the second semiconductor region, it is noted first that the first semiconductor region has a substantially uniform impurity concentration within the region thereof through which the depletion layer extends and that the thickness thereof is generally greater than the thickness to which the depletion layer expands.

Depending on the fabrication method employed, the second semiconductor region can, at the main operational portion of the device, be given an even impurity concentration distribution or be given an impurity distribution in accordance with various distribution coefficients. In the simplest case, the impurity distribution is uniform, which is the distribution obtained when the epitaxial growth method is employed and the one which provides a relationship between the impurity concentration and the thickness Dt that is particularly convenient for understanding the operation of the device according to this invention.

In the figures, the symbol Ed denotes the edge of the depletion layer.

FIG. 2 is a graph showing the case of uniform impurity concentration distribution in the first and second semiconductor regions. The second semiconductor region 2 is positioned between the third region 3 and the first semiconductor region 2 and has a thickness Dt. The vertical axis of the graph represents distance x and the horizontal axis represents the impurity concentration N. The impurity concentration N1 of the first semiconductor region 1 and the impurity concentration N2 of the second semiconductor region 2 have opposite signs since these regions are of opposite conductivity types and the charges thereof are of opposite sign in the depleted state.

The breakdown voltage $V_{BR}$ of the device according to the present invention is the voltage at which the punch-through condition is initiated in the second semiconductor region 2 and since this voltage approximates the voltage at which the depletion layer expands from the first semiconductor region 1 toward the second semiconductor region 2 by the amount Dt, this voltage can be approximately represented by $$V_{BR} = \frac{qN2}{2\epsilon_{se}} \left( \frac{N2}{N1} + 1 \right) Dt^2 \quad (1)$$

where $\epsilon_{se}$ is the dielectric constant of the semiconductor and q is the charge of a single electron ($1.6 \times 10^{-19}$ coul.). From this it can be easily seen that even if the impurity concentration of the first semiconductor region 1 is fixed, the breakdown voltage $V_{BR}$ can be varied by varying the impurity concentration N2 of the second semiconductor region 2 or the thickness Dt of the same, the thickness Dt being determined by the separation between the first semiconductor region 1 and the third region 3. In the graph in FIG. 3, $V_{BR}$ curves are shown for two examples using silicon as the semiconductor, one in which $N1 = 10^{15}$ cm$^{-3}$ and one in which $N1 = 10^{14}$ cm$^{-3}$, with the thickness Dt of the second semiconductor region 2 represented on the vertical axis and the impurity concentration represented on the horizontal axis. The maximum value of the breakdown voltage $V_{BR}$ is determined by the impurity concentration N1 and is difficult to set higher than the avalanche breakdown voltage (about 300 V when $N1 = 10^{15}$ cm$^{-3}$ and about 1500 V when $N1 = 10^{14}$ cm$^{-3}$).

When the second semiconductor region 2 is formed by impurity diffusion, N1 and N2 are not generally uniform and more often than not there is an impurity distribution such as represented by $$N2 = N20 \cdot \exp\left(-\frac{x^2}{4D_2 t_2}\right) - N30 \cdot \exp\left(-\frac{x^2}{4D_3 t_3}\right) \quad (2)$$

$$N1 = N20 \cdot \exp\left(-\frac{x^2}{4D_2 t_2}\right) - N10 \quad (3)$$

In such a case, a general determination of $V_{BR}$ can be carried out in accordance with formula (1) using N10 as N1 and, as N2, using $$N2 = \frac{1}{t} \left| \int_{x_2}^{x_3} N1 \, dx \right|$$

The precise value will, however, have to be determined by detailed numerical computation.

In the surge absorption device according to the present invention, the surge current distribution following the occurrence of punch-through between the first semiconductor region and third region is relatively uniform. If, however, an even more uniform distribution is desired, a structure like that shown in FIG. 4 can be used.

Figure 4:
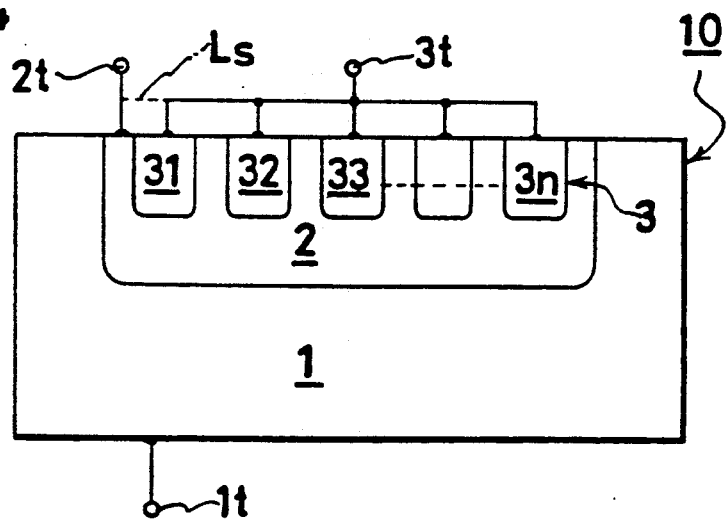
FIG. 4 is a schematic illustration of the structure of a second embodiment of the device according to the invention.

In the embodiment shown in FIG. 4, the second semiconductor region 2 formed in the semiconductor substrate, i.e. the first semiconductor region 1, and exhibiting the same type of conductivity from the first semiconductor region 1 is formed with a third region 3 constituted of a plurality of third region elements 31, 32, 33, ... 3n (n=5 in the illustrated embodiment) which are connected by a common terminal 3t extending to the exterior.

With this structure it is possible to avoid the electric field concentration effect seen in the conventional avalanche breakdown type device and to obtain a uniform current distribution. As a result, it is also possible to obtain a current capacity that increases approximately in proportion to increasing device surface area.

The other considerations mentioned earlier in connection with the first embodiment apply equally well to the embodiment shown in FIG. 4. Also similarly to what was noted earlier, in view of the principle of operation, it is not only possible to short-circuit the terminals 2t and 3t but advantageous to do so since this is effective toward avoiding the transient phenomena.

In a surge absorption device having the structure contemplated by the present invention, poor control characteristics may result if the breakdown voltage determined by the occurrence of punch-through is close to the avalanche breakdown voltage between the first semiconductor region 1 and the second semiconductor region 2.

Figure 5:
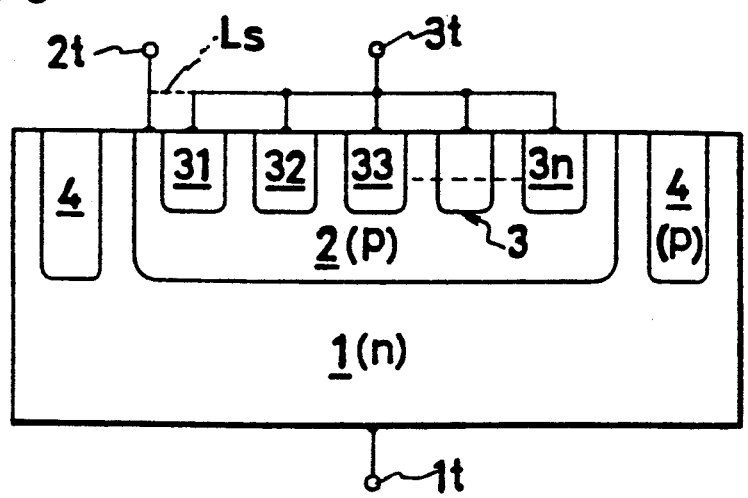
FIG. 5 is a schematic illustration of the structure of a third embodiment of the device according to the invention.

When this possibility arises, in order to suppress the avalanche breakdown initiated at the junction at the periphery of the second semiconductor region 2 it is advisable to provide around the second semiconductor region 2 a guard ring region 4 of the same conductivity type as that of the second semiconductor region 2 as shown in FIG. 5 or to provide on the surfaces of the second and third regions 2 and 3 a continuous ohmic electrode 5 each edge 5a of which extends over the part of an insulation film 6 provided to straddle the junction between the edge of the second semiconductor region 2 and the first semiconductor region 1 as shown in FIG. 6.

The additional structural elements shown in FIGS. 5 and 6 serve to alleviate the concentration of electric field at the edges of the second semiconductor region 2 and in effect to increase the avalanche voltage, in this way broadening the freedom of design as regards determining the breakdown voltage purely in terms of punch-through as contemplated by the present invention.

In the case of the surge absorption device according to the present invention, there is no need for any auxiliary processing such as the edge abrasion processing that has been required in the case of the conventional avalanche breakdown type device. Therefore, in the case of each of the embodiments described in the foregoing, it is possible to simultaneously fabricate a plurality of the devices into one and the same semiconductor substrate 1.

This fact not only makes it possible to provide an array chip with a plurality of integrated surge absorption devices but also, as was mentioned earlier, makes it possible at the same time as fabricating the devices to interconnect the fabricated devices in arrangements that are suitable in view of the manner in which the surge absorption devices of this type are ordinarily used.

More specifically, when surge absorption devices of this type are actually used for building a surge absorption circuit, it is the general practice to connect two surge absorption devices back to back (back-to-back connection) or face to face (front-to-front connection) where protection is to be provided between two lines, and to connect three devices in star connection where protection is to be provided among three lines. Thus, in general, for protection among n number of lines, the anodes or cathodes or n number of surge absorption devices are connected together at the same node.

Consequently, as shown in FIG. 7, when n number of surge absorption devices according to this invention are formed in one and the same first semiconductor region, they can be connected in either back-to-back or star arrangement without need for any external connection.

For instance, FIG. 7(A) shows an example in which two surge absorption devices 10 according to the embodiment illustrated in FIGS. 5 or 6 are formed in one and the same semiconductor substrate. The equivalent circuit of this arrangement where the semiconductor substrate is of n-type conductivity is as shown in FIG. 7(B). As will be noted, in one of the surge absorption devices the terminals 2t and 3t of the second and third regions are connected as a common first terminal ta while in the other device the corresponding terminals are connected as a common second terminal tb, whereby it is possible to realize back-to-back or front-to-front connection.

Stated differently, where only back-to-back connection or the like is to be used with respect to one prescribed type of application, there is no particular need to provide the terminal 1t for the common first semiconductor region 1 or semiconductor substrate. (This is why this terminal is shown by a phantom line in the drawing.) On the other hand, if the terminal 1t is formed, it then of course becomes possible to connect the surge absorption not only in the back-to-back connection described above but also in parallel connection.

That is to say, if the terminals ta and tb are connected together and surge absorption is carried out between these connected terminals and the terminal 1t, then insofar as there is no problem regarding disparity in characteristics between the two surge absorption elements 10, the current capacity during surge absorption will be doubled.

From FIG. 7 it will be further easily understood that if n number of surge absorption devices are formed in one and the same semiconductor substrate, it will be possible to realize a star connection of n number of devices.

The composite device shown in FIG. 7(A) can further optionally be provided on the bottom surface of the semiconductor substrate with a metallic layer 7 for reducing the equivalent electrical resistance and for facilitating connection of the terminal 1t, and on the top surface thereof with a protective insulation layer 8.

It should also be noted that in a case where there is no need to integrate a plurality of devices, it is of course possible to first form the second semiconductor region over the entire surface of the first semiconductor region and then to obtain devices having the prescribed area by cutting.

Figure 8A:
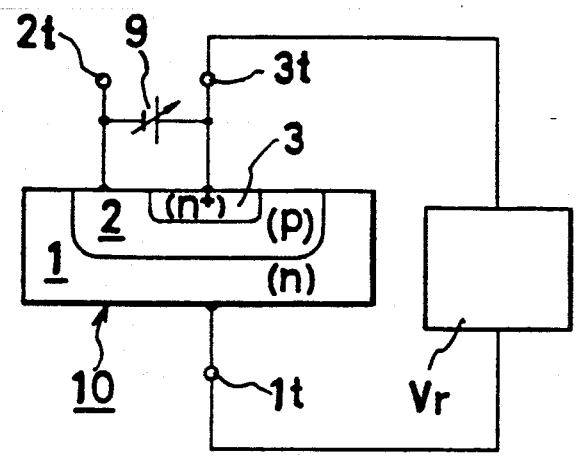
FIGS. 8(A) and 8(B) are a circuit diagram and an energy band diagram for explaining the operating principle of the fundamental device.

In all of the aforesaid embodiments, when the second and third regions 2 and 3 are provided with independent terminals 2t and 3t, it becomes possible, as shown in FIG. 8(A), to provide an appropriate bias source 9 between the terminals 2t and 3t so as to enable adjustment of the punch-through voltage from the exterior.

Figure 8B:
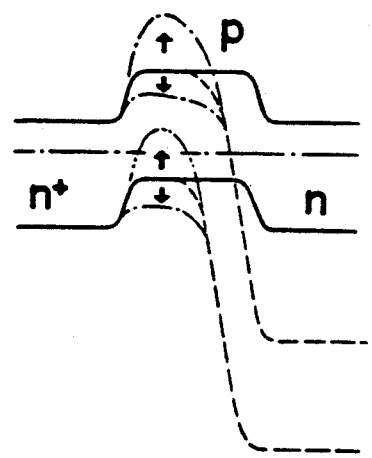

In FIG. 8(A) the application of surge is simulated by connecting a high voltage (surge) source between the third region terminal 3t and the substrate terminal 1t. As shown in FIG. 8(B), the energy band structure of this surge absorption device is such that it changes from the state indicated by the solid lines under no application of surge voltage to the state indicated by the dashed lines under application of a high voltage Vr corresponding to a surge voltage. In the illustrated case, however, because of the bias effect which will be described hereinafter, the potential corresponding to a surge voltage applied by the high voltage source has not yet reached a level sufficient for causing punch-through.

In this state, depending on the polarity and magnitue of the bias potential supplied by the bias source 9, the energy band structure changes as indicated by the upward pointing arrows in the case that a reverse bias is applied across the second and third regions, and as indicated by the downward pointing arrows in the case that a forward bias is applied thereacross. Therefore, by controlling the polarity and magnitude of the bias potential it becomes possible to control the punch-through voltage of the surge absorption device from the exterior.

Figure 9:
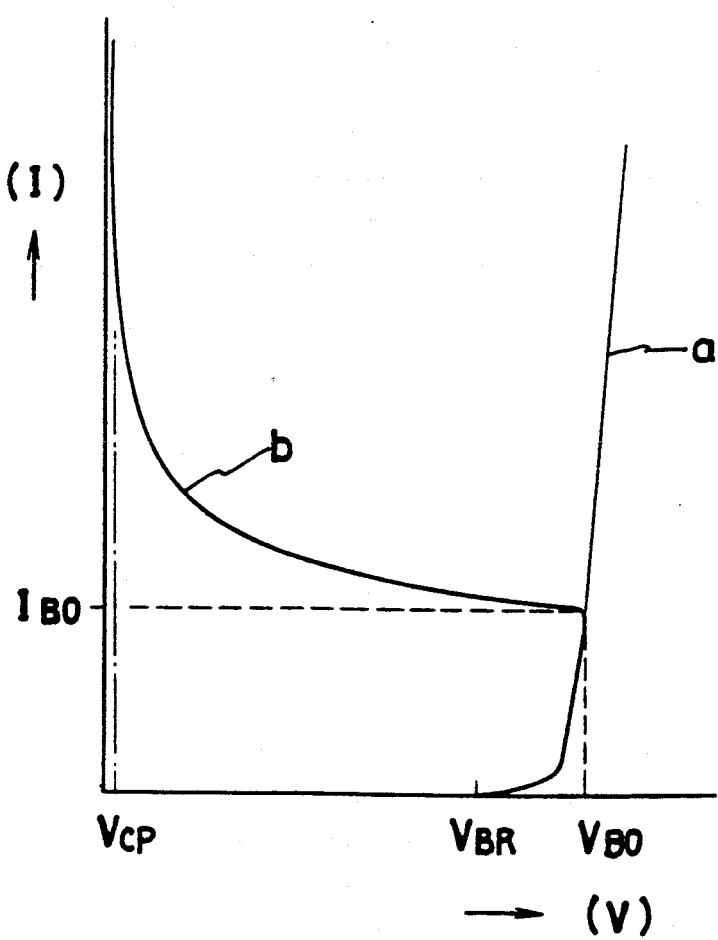
FIG. 9 is a graph showing the characteristic curves of the operating voltage and current.

In the foregoing embodiments of the surge absorption device according to this invention, the voltage-current characteristics are roughly as shown by the curve a in FIG. 9. More specifically, when the voltage applied across the device comes to exceed the breakdown voltage $V_{BR}$, device current begins to flow, whereafter the parameters including equivalent resistivity of the device make it possible to obtain a correlation between the applied voltage and the absorbed current at a prescribed rate of change.

The fabrication of the surge absorption device according to this invention will now be explained with reference to an experiment carried out with respect to the embodiment shown in FIGS. 5 and 6.

As the starting material for the first semiconductor region 1 there was used a 300 μm-thick silicon wafer exhibiting a resistivity of 5 Ω-cm, n-type conductivity, and a (111) surface. As the first step, a 6000 Å SiO$_2$ film was formed on the front and back surfaces of the wafer.

The SiO$_2$ film was then removed from only the back surface and phosphorus was diffused into the wafer at a high concentration to a depth of 3 μm.

Next, in order to define the two-dimentional configuration of the second semiconductor region 2, the SiO$_2$ film on the front surface was subjected to photoetching in accordance with a predetermined pattern so as to produce an impurity diffusion window. Boron was then diffused through the diffusion window to form a p-type region to a depth of 2.5 μm.

In order to define the planar configuration of a plurality of third region elements 3l–3n, another SiO$_2$ film was formed on the front surface of the wafer and this film was then subjected to photoetching in accordance with a predetermined pattern so as to produce a plurality of impurity diffusion windows for formation of a plurality of third region elements. Phosphorus was diffused through these windows at high concentration, whereby the third region 3 was formed as a group of n$^+$-type third region elements 3l–3n of a depth of 1.2 μm. As a result, a second semiconductor region 2 having an effective depth Dt of 1.3 μm was simultaneously produced.

Following this, photoetching and vacuum deposition of a thin metallic film were carried out to form the electrode 5 and the terminals 1t, 2t, 3t.

The surge absorption device fabricated by this process exhibited a breakdown voltage of 120 V and was able to absorb a surge current of 800 A/cm$^2$.

Additional surge absorption devices were fabricated under identical conditions to those mentioned above except that at the time of forming the n$^+$-type third region, which substantially determines the effective thickness of the second semiconductor region 2, the diffusion time was varied from device to device. As a result, it was possible to fabricate devices having breakdown voltages ranging from 30 V to 170 V. Moreover, this is by no means the largest range over which the breakdown voltage can be varied. It was confirmed that by further adjusting other fabrication conditions it is possible to vary the breakdown voltage over a range extending from several volts up to several hundred volts.

It was also confirmed that the breakdown mechanism of the surge absorption device according to this invention can be controlled so that it does not rely at all on tunneling or avalanche but solely on punch-through.

While the voltage-current characteristics of the aforesaid embodiments are as represented by the curve a in FIG. 9, it is possible where convenient for the application at hand to lower the terminal voltage across the device in the clamping state following breakdown (i.e. the clamp voltage). This is often advantageous since when the clamp voltage following breakdown is high the device, which constitutes the discharge path for the surge current, consumes more power, specifically an amount of power equal to the product of the clamp voltage and the absorbed current, so that it also generates more heat.

Depending on the device structure, it is also possible that the clamp voltage may become higher than the breakdown voltage, in which case the amount of heat produced will be especially high. In cases where the surge current is large, this becomes a problem that cannot be ignored. In the following, therefore, there is proposed a device structure which enables the clamp voltage at the time of surge current discharge to be set adequately low, thus assuring discharge of large surge currents with minimum heat generation.

Figure 10:
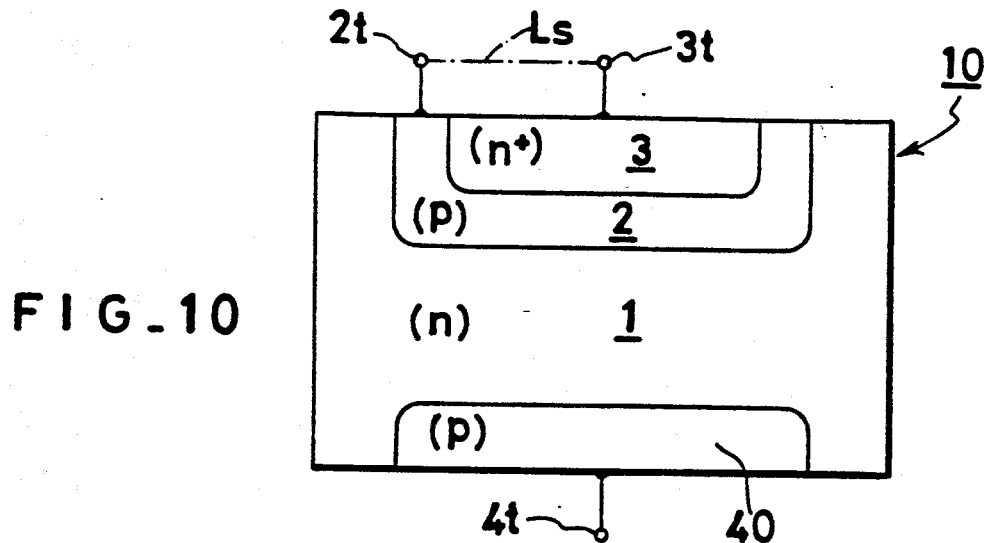
FIG. 10 is a schematic illustration of the structure of a sixth embodiment according to the invention.

Most elements of the surge absorption device depicted in FIG. 10 have the same function as their counterparts in FIG. 1. These elements are assigned the same reference numerals as those in FIG. 1 and will not be described further here.

The device 10 according to this embodiment also comprises a first semiconductor region 1 exhibiting a first type of conductivity and second and third regions 2, 3 formed from the top substrate surface by double diffusion. In addition, it has a fourth region 40 formed on the opposite surface of the substrate from that on which the second and third regions 2 and 3 are formed. The only requirement for this fourth region 40 is that it be formed of a material which with respect to the first semiconductor region 1 forms an injection junction capable of injecting minority carriers therein. The fourth region 40 need not necessarily be formed of a semiconductor of the opposite conductivity as shown in the illustrated embodiment, but can instead be formed of a material such as silicide, or in the case of the first semiconductor region 1 being of p-type, can be formed of a metal capable of injecting electrons therein. Also the third region 3 need not be of a semiconductor, but may be of an electrically conductive material capable of forming a carrier injecting junction with the second semiconductor region.

Opposite to the terminals 2t, 3t connected to the second and third regions 2 and 3 is provided another terminal 4t connected with the fourth region 40 so as to permit the discharge of surge current between the terminals 2t, 3t on the one side and the terminal 4t on the other.

In this device, as in the embodiments described earlier, when a reverse bias is applied across the pn junction between the first semiconductor region 1 and the second semiconductor region 2, the resulting depletion layer not only extends on the side of the first semiconductor region 1 but also extends toward the side of the third region 3. Thus, when a large surge voltage comes to be applied between the terminals 2t, 3t on the one side and the terminal 4t on the other, the depletion layer expands up to the third region 3. This state is tantamount to a punch-through state between the first semiconductor region 1 and the third region 3 and is a state of low impedance permitting the flow of a large current, meaning that it is the beginning of the breakdown state of the present surge absorption device. In FIG. 9 this beginning point is indicated on the voltage axis as the breakdown voltage $V_{BR}$.

Once this initial breakdown state occurs, surge current starts to flow between the terminals 2t, 3t and the terminal 4t, holes are injected into the first semiconductor region 1 from the fourth region 4, and the injected holes collect in the second semiconductor region 2, from where they pass through the terminal 2t as external current (device current).

Therefore, when the product of this current and the resistance of the second semiconductor region 2 between the bottom of the third region 3 and the surface of the second semiconductor region 2 (i.e., the resistance of a portion of the second semiconductor region 2 corresponding to the thickness of the third region 3) becomes equal to the forward voltage of the pn junction diode formed by the second and third regions 2 and 3, electrons are injected into the second semiconductor region 2 from the third region 3, whereby the current increases, and holes are again injected from the fourth region 40. Thus positive feedback is established.

The current value at which this positive feedback arises is the breakover current $I_{BO}$ mentioned earlier, and the voltage across the device terminals (between the terminal 3t and the terminal 4t) is the breakover voltage $V_{BO}$.

While, as was mentioned earlier, the breakover voltage $V_{BO}$ is somewhat larger than the breakdown voltage, once positive feedback starts, the voltage across the device terminals drops to a very low value. This value is shown as the clamp voltage $V_{CP}$ on the curve b in FIG. 9. Its actual level is approximately equal to a sum of the product of the absorbed current and the series resistance of the various portions of the device, and the forward voltage of the pn junction.

As will be understood from this mechanism, when no surge voltage is acting on the surge absorption device 10 of FIG. 10, a high breakdown voltage is maintained and the amount of current flowing through the device is held to a minimum so that wasteful power consumption by the device is prevented. On the other hand, once a surge of a voltage exceeding the breakdown voltage comes to act on the device, the device immediately provides a very low clamp voltage so that the large surge current is absorbed and the circuit system connected therewith is reliably protected.

The breakdown voltage of the surge absorption device providing the aforesaid operation can be freely determined within a considerably broad range at the design stage not only by controlling the resistivity or impurity concentration of the first semiconductor region 1 but also by proper determination of the punch-through voltage through control of the effective thickness Dt of the second semiconductor region 2, which thickness is defined by the separation between the first and third regions, and through control of the impurity concentration of the second semiconductor region 2. In this embodiment, the fourth region 4 can, similarly to the second and third semiconductor regions 2 and 3, be formed with high controllability using a conventional impurity diffusion or epitaxial growth method.

Figure 11:
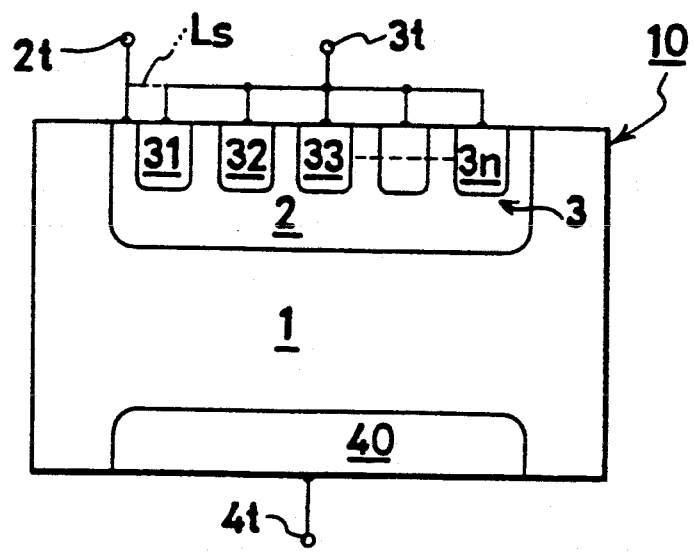
FIG. 11 is a schematic illustration of the structure of a seventh embodiment according to the invention.

In the surge absorption device according to the present embodiment, the surge current distribution following the occurrence of punch-through is relatively uniform. If, however, an even more uniform distribution is desired, this can be realized by providing the structure shown in FIG. 4 with the fourth region 40 as shown in FIG. 11. In this case, as is clear from FIG. 11, the second semiconductor region 2 is first formed in the first semiconductor region 1 by diffusion of impurity, a plurality of third region elements 31, 32, ..., 3n are formed within the second semiconductor region 2 and the fourth region 40 is formed in the bottom surface of the first semiconductor region 1.

With this structure it is possible to avoid the electric field concentration effect seen in the conventional avalanche breakdown type device and to obtain an even current distribution. As a result, it is possible to obtain a current capacity that increases approximately in proportion to increasing device surface area.

The other considerations mentioned in connection with the earlier described embodiments apply equally well to the embodiment shown in FIG. 11. Also similarly to what was noted earlier, in view of the principle of operation, it is not only possible to short the terminals 2t and 3t but advantageous to do so since this is effective toward avoiding the transient phenomena.

Further, in the embodiments of the surge absorption device described so far, poor control characteristics may result if the breakdown voltage determined by the occurrence of punch-through is close to the avalanche breakdown voltage between the first semiconductor region 1 and the second semiconductor region 2.

Figure 12:
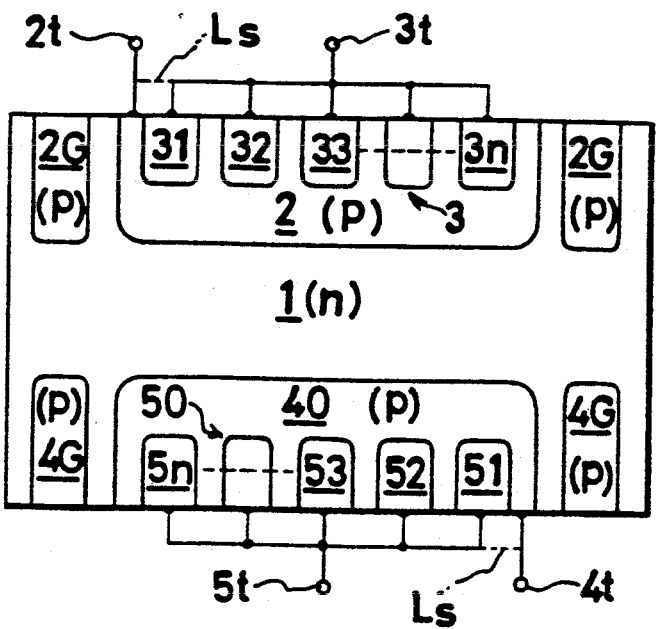
FIG. 12 is a schematic illustration of the structure of an eighth embodiment according to the invention.

When this possibility arises, in order to suppress the avalanche breakdown initiated at the junction at the periphery of the second semiconductor region 2, a guard ring 2G of the same conductivity type as that of the second semiconductor region can be provided in a manner similar to the guard ring of the embodiment of FIG. 5 so as to surround the second semiconductor region 2 as shown in FIG. 12. Alternatively, as shown in FIG. 13, the surfaces of the second and third regions 2 and 3 can be provided with a continuous ohmic electrode 46 each edge 46a of which extends over the part of an insulation film 48 provided to straddle the junction between the edge of the second semiconductor region and the first semiconductor region 1.

By these means it is possible to alleviate the concentration of electric field at the edges of the second semiconductor region 2 and in effect to increase the avalanche voltage, in this way broadening the freedom of design as regards determining the breakdown voltage purely in terms of punch-through as contemplated by the present invention.

In the arrangement shown in FIG. 12, a plurality of fifth region elements 51, 52, ..., 5n substantially identical with the third region elements 31, 32, ..., 3n and constituting a fifth region 50 are provided within the fourth region 40. In this case, the fourth region 40 is formed of a semiconductor. Moreover, the terminals 4t and 5t of the fourth and fifth regions 40 and 50 are electrically short-circuited in the same manner as the terminals 2t and 3t of the second and third regions 2 and 3.

Figure 13:
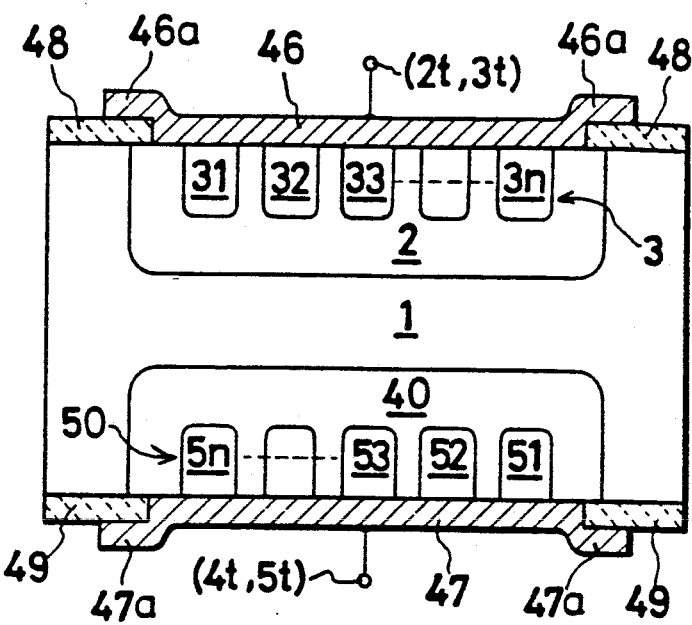
FIG. 13 is a schematic illustration of the structure of a ninth embodiment according to the invention.

On the other hand, in the surge absorption device illustrated in FIG. 13, the fourth region 40, the fifth region 50, the ohmic electrode 47 and the edges 47a have the same structural arrangement as the second semiconductor region 2, the third region 3, the ohmic electrode 46 and the edges thereof 46a.

As a result, in the surge absorption devices shown in FIGS. 12 and 13, depending on the polarity of the surge voltage acting between the terminals 3t and 4t, the diode at which punch-through occurs will in some cases be the first diode between the first semiconductor region 1 and the second semiconductor region 2 and in other cases be the second diode constituted between the first semiconductor region 1 and the fourth region 40. However, regardless of which diode punch-through occurs at, the operating mechanism is completely the same as that explained regarding the fundamental device structure shown in FIG. 1 or regarding the diode formed between the first semiconductor region 1 and the second semiconductor region 2 of the device shown in FIG. 11. In other words, the surge absorption devices shown in FIGS. 12 and 13 are capable of absorbing surge voltages and currents of either polarity. In these devices it is of course possible as in the earlier embodiments to determine the breakdown voltage with respect to the surge voltage with a high degree of freedom in design and to make the clamp voltage sufficiently smaller than the breakdown voltage.

The only difference in operation between the devices of FIGS. 12 and 13 is that in the means for suppressing the avalanche breakdown tending to occur at the peripheries of the second semiconductor region and the fourth region. The device according to FIG. 12 is provided with guard rings 2G and 4G exhibiting the same type of conductivity as the second and fourth regions 2 and 40 and respectively surrounding the second semiconductor region 2 and the fourth region 40, while the embodiment shown in FIG. 13 is provided with a continuous ohmic electrode 46 extending over the surfaces of the second semiconductor region 2 and the third semiconductor region 3 and with a continuous ohmic electrode 47 extending over the surfaces of the fourth region 40 and the fifth region 50, in such manner that each edge 46a of the continuous ohmic electrode 46 extends over the part of an insulation film 48 straddling the junction between the second semiconductor region 2 and the first semiconductor region 1 and that each edge 47a of the continuous ohmic electrode 47 extends over the part of an insulation film 49 straddling the junction between the fourth region 40 and the first semiconductor region 1. In the devices of FIGS. 12 and 13, while the third and fifth regions 3 and 50 are respectively constituted of a plurality of region elements 31–3n and a plurality of region elements 51–5n, it is, in accordance with the most basic structure, alternatively possible to form the third region 3 and the fifth region 50 as unitary regions, in the manner as typified by the embodiments of FIG. 1 and FIG. 8.

As will be understood from the embodiments described in the foregoing, in the case of a surge absorption device according to this invention, once the device has been fabricated it requires no auxiliary processing such as the edge abrasion and the like required in the case of the conventional avalanche breakdown type device. Therefore, in the case of each of the aforesaid embodiments it is possible to simultaneously produce a plurality of the devices in a single semiconductor substrate.

Figure 14:
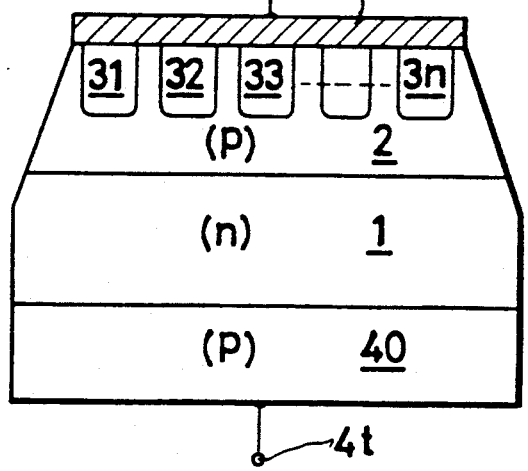
FIG. 14 is a schematic illustration of the structure of a tenth embodiment according to the invention.

On the contrary, where there is no need to integrate a plurality of the devices, it is possible as the aforementioned means for increasing the avalanche breakdown voltage to subject the portion corresponding to the edge of the junction between the first and second semiconductor regions to etching or cutting processing either perpendicularly to the surface or along a plane inclined at an angle thereto, as shown in FIG. 14. Although the case shown in FIG. 14 relates to a surge absorption device corresponding to that of FIG. 10, application of the same structure to the device of FIG. 11 is also possible. In using such a simple expedient as this, however, it is generally necessary to provide the cut surface with an appropriate protective film (not shown).

Figure 15:
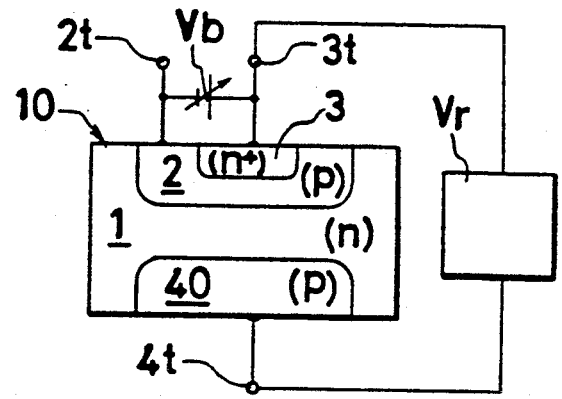
FIG. 15 is a schematic illustration for explaining the operating principle of the device of FIG. 10.

The surge absorption devices having the fourth region, as typified by the embodiment shown in FIG. 10, can be used in another way. Namely, if as shown in FIG. 15 the terminals 2t and 3t of the second semiconductor region 2 and the third region 3 are separately led out and an appropriate bias source Vb is connected between these two terminals, it then become possible to control the punch-through voltage from the exterior. When the application of surge is simulated by connecting a high voltage source Vr between the third region terminal 3t and the terminal 4t of the fourth region 40, the same operational results as explained with respect to FIG. 8(B) are obtained.

Figure 16:
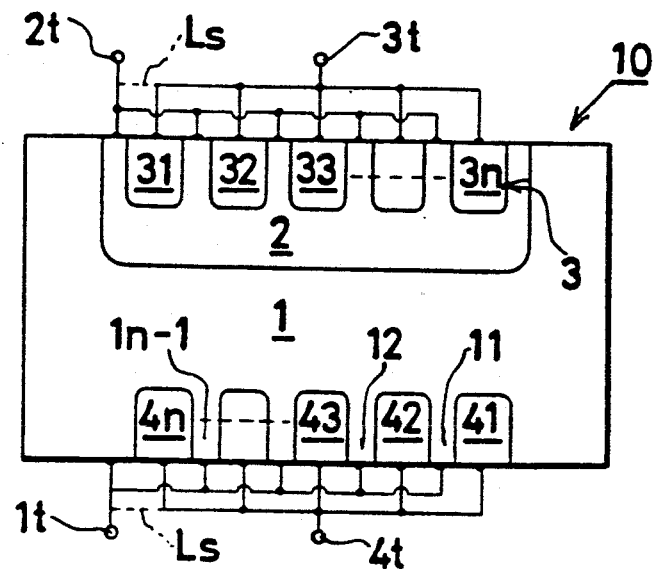
FIG. 16 is a schematic illustration of the structure of an eleventh embodiment according to the invention.

Experiments carried out by the inventors to compare the surge absorption capabilities of devices with and without the fourth region showed that while a device not having the fourth region exhibited a breakdown voltage of 120 V and a maximum surge current absorption of 800 A/cm$^2$, a device provided with the fourth region exhibited a breakdown voltage of 121 V, a breakover current of 4 A/cm$^2$, and a maximum surge current absorption of 10000 A/cm$^2$. This result clearly demonstrates the effect of the fourth semiconductor region.

Where it is desired to increase transient noise immunity further so that the device will not respond to a transient noise large in time-differentiation of noise voltage (dv/dt), it is advisable to increase the contact area between the second semiconductor region and/or the fourth region and the metallic film, or, as shown in FIG. 16, to form the fourth region 40 of a group of region elements 41, 42, ..., 4n, thus forming between these fourth region elements a plurality of laterally spaced first semiconductor region portions 11, 12, ..., 1n−1, to provide these first semiconductor region portions 11, 12, ..., 1n−1 with a common electrode making ohmic contact therewith so as to constitute a terminal 1t, and to similarly provide the fourth region elements 41, 42, ..., 4n with a common path comprising a terminal 4t.

Both of these methods enable the transient noise immunity to be freely selected from within a considerably broad range at the time of device design.

Figure 17:
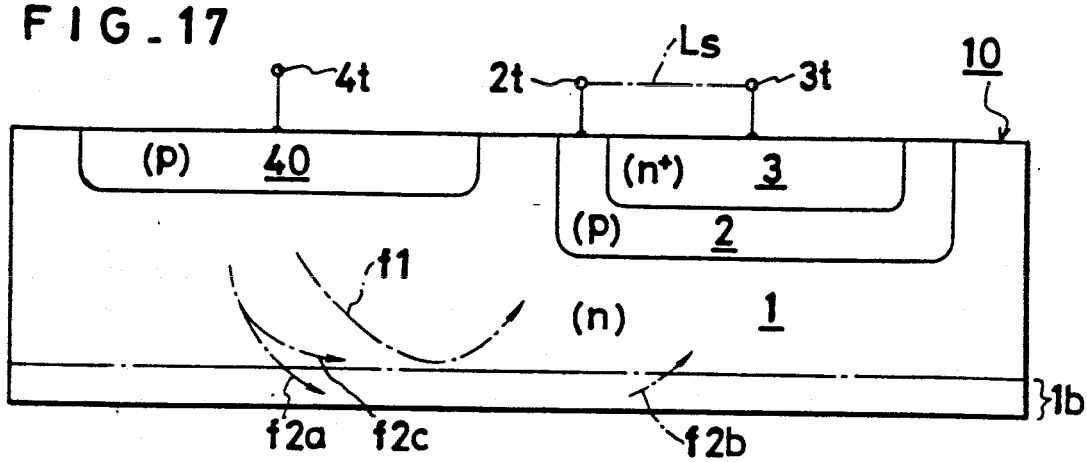
FIG. 17 is a schematic illustration of the structure of a twelfth embodiment according to the invention.

FIG. 17 shows another modification of the device having the fourth region 40. In this case the fourth region 40 is disposed laterally of the second semiconductor region 2 and the third region 3. This layout provides a great improvement in device productivity since it eliminates the need for photolithographically treating both sides of the substrate, and also provides and advantage from the point of fabrication ease since the terminals can all be connected from the same side. As shown in the drawing, it is further preferable to provide the bottom of the semiconductor substrate i.e., the first semiconductor region 1 with a high-concentration impurity layer 1b, though it should be noted that this impurity layer 1b is not an essential feature of the invention and should not be construed as being limitative. This embodiment comprises the same first to fourth regions as described with respect to the foregoing embodiments and its operation will be described in respect of the case where surge voltage is applied between the terminals 2t and 3t, which are electrically short-circuited by the line Ls, on the one hand and the terminal 4t on the other. The application of reverse bias across the pn junction between the first semiconductor region 1 and the second semiconductor region 2 causes a depletion layer formed within the second region 2 to extend from the first region 1 to the third region 3 thus establishing the punch-through state and initiating breakdown.

Once this initial breakdown state occurs, surge current starts to flow between the terminals 2t, 3t and the terminal 4t, holes are injected into the first semiconductor region 1 from the fourth region 40, and the injected holes are collected in the second semiconductor region 2, from where they pass through the terminal 2t as external current (device current). The hole current across the region 2 brings about a voltage drop along the region 2 and forward biases the junction between the regions 2 and 3 allowing minority carrier injection into the region 2 from the region 3. Thus positive feedback is established with the device in breakover condition. The operational principles here are the same as those described previously with regard to FIG. 10. Thus at the time a surge current arises, it is possible to attain an exceedingly low clamp voltage as shown by curve b in FIG. 9, whereby large surge currents can be effectively discharged.

Provision of the impurity layer 1b is preferable since it facilitates the efficient transfer of carriers. This layer 1b is formed on the back surface of the semiconductor substrate (i.e. the first semiconductor region 1) as a high-concentration impurity layer, which may be of either $n^+$- or $p^+$-type, regardless of the conductivity type of the first semiconductor region 1. Referring to FIG. 17, if the first semiconductor region 1 is of an n-type semiconductor and the conductivity of the high-concentration impurity layer 1b is selected as the $n^+$-type, a type of built-in electric field will be formed by the high-concentration impurity layer 1b and the first semiconductor region 1, whereby, as indicated by the arrow f1 in FIG. 17, holes injected from the fourth region 40 will be turned back in the vicinity of the high-concentration impurity layer 1b so as not to pass through the back surface of the first semiconductor region 1.

On the other hand, if a high-concentration impurity layer 1b of $p^+$-type is provided on the back surface of an n-type first semiconductor region 1, then, as schematically indicated by the arrows f2a and f2b in FIG. 17, the holes once entering the high-concentration impurity layer 1b will, because of the saturation of this layer with holes, be re-ejected therefrom or, as indicated by the arrow f2c, be turned back thereby, so that in this case too the passage of holes through the back surface of the first semiconductor region will be prevented.

Figure 18:
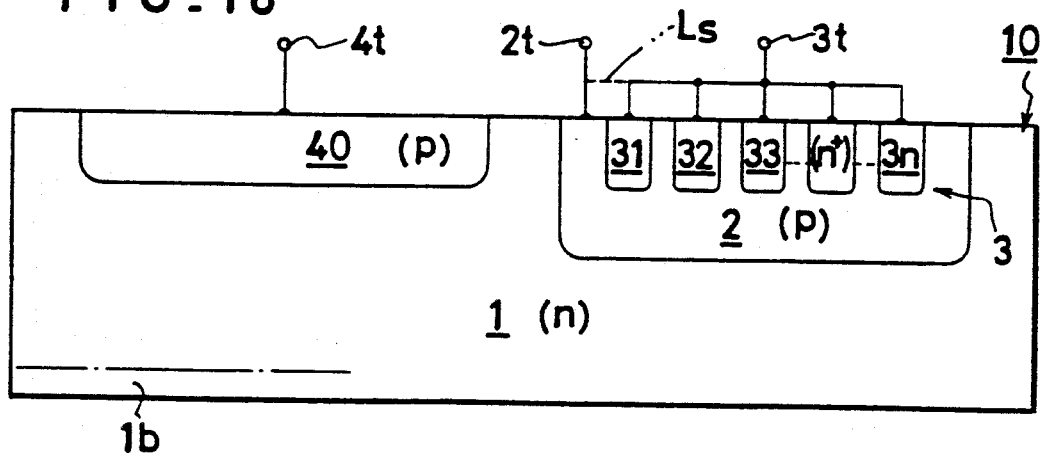
FIG. 18 is a schematic illustration of the structure of a thirteenth embodiment according to the invention.

FIG. 18 shows an embodiment of the surge absorption device according to the invention which, in order to assure more uniform current distribution during punch-through operation, is provided with a plurality of third region elements 31, 32, ..., 3n like those in the embodiment of FIG. 4 etc. With this structure it is possible to avoid the electric field concentration effect and to obtain an even current distribution. As a result, it is also possible to obtain a current capacity that increases approximately in proportion to increasing device surface area. In this embodiment it is also possible to provide a high-concentration impurity layer 1b on a part of the bottom surface of the semiconductor substrate, as indicated by the phantom line in FIG. 18.

In the foregoing embodiments, poor control characteristics may result if the breakdown voltage determined by the occurrence of punch-through is close to the avalanche breakdown voltage between the first semiconductor region 1 and the second semiconductor region 2. Modifications of the embodiments according to FIGS. 12 and 13 are therefore shown in FIGS. 19 and 20.

Figure 19:
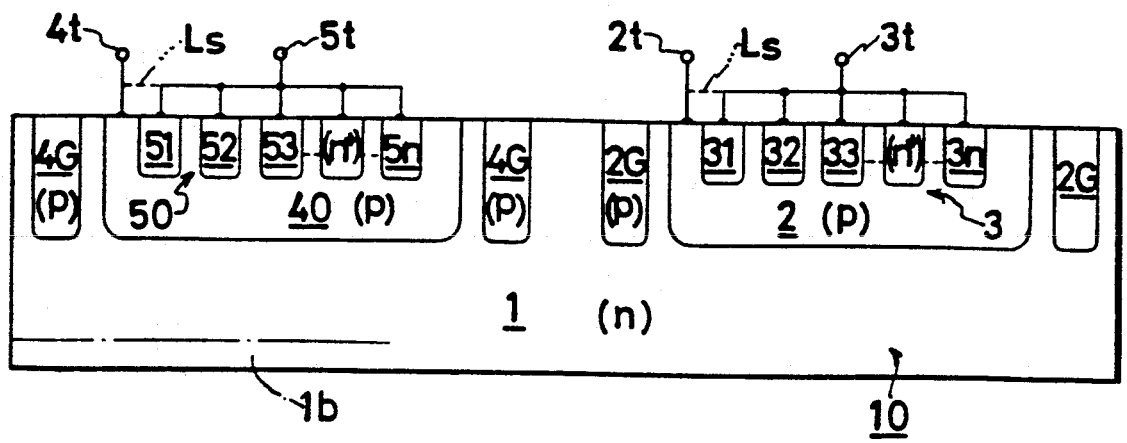
FIG. 19 is a schematic illustration of the structure of a fourteenth embodiment according to the invention.

In the device according to FIG. 19, the second semiconductor layer 2 is surrounded by a guard ring region 2G of the same conductivity type as the second semiconductor region 2. On the other hand, in the device according to FIG. 20, the surfaces of the second and third regions 2 and 3 are provided with a continuous ohmic electrode 46 each edge 46a of which extends over the part of an insulation film 48 provided to straddle the junction between the edge of the second semiconductor region 2 and the first semiconductor region 1.

In the aforesaid arrangements, the structures of the fourth region 40 and the fifth region 50 formed of the fifth region elements 51, 52, ..., 5n can be the same as those of the second region 2 and the third region 3, respectively, and the operational results obtained are the same as those of the corresponding devices of FIGS. 12 and 13.

Figure 21:
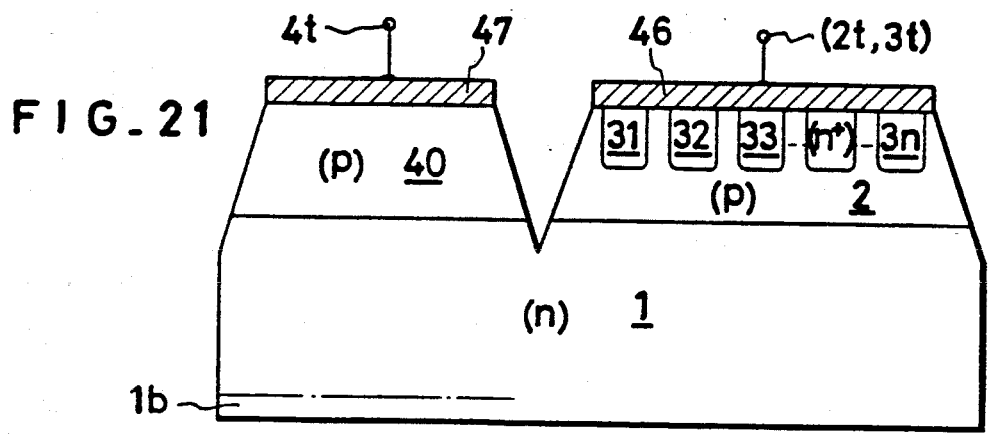
FIG. 21 is a schematic illustration of the structure of a sixteenth embodiment according to the invention.

In the case of the surge absorption device according to the aforesaid embodiments, there is no need for any auxiliary processing such as the edge abrasion processing that has been required in the case of the conventional avalanche breakdown device. Therefore, it is possible to simultaneously fabricate a plurality of the devices into one and the same semiconductor substrate. On the contrary, where there is no need to integrate a plurality of devices, it is possible as the aforementioned means for increasing the avalanche breakdown voltage to subject the portion corresponding to the edge of the junction between the first and second semiconductor regions to etching or cutting processing either perpendicularly to the surface or along a plane inclined at an angle thereto, as shown in FIG. 21. In this connection, it should be understood, however, that the inclined faces on opposite sides of the device are not an essential feature of the present embodiment. Moreover, when provided, the cut inclined surfaces are generally covered with an appropriate protective film.

Figure 22:
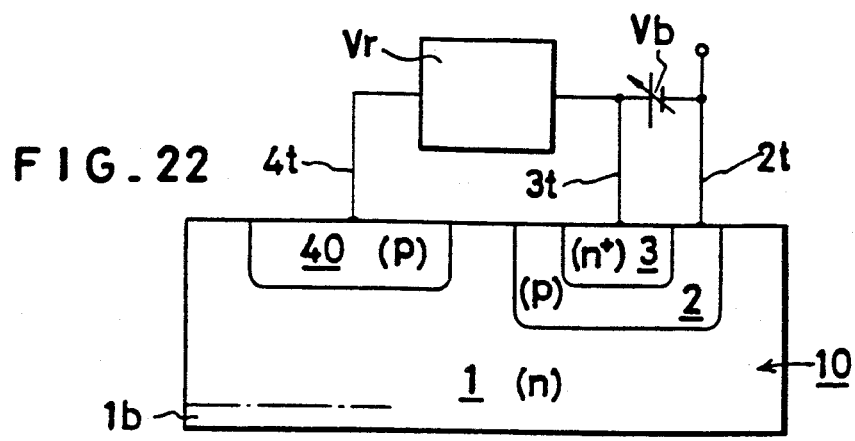
FIG. 22 is a schematic illustration for explaining the operating principle of the device of FIG. 17.

FIG. 22 shows an arrangement structurally equivalent to that shown in FIG. 15 and exhibiting the characteristics shown in FIG. 8(B). When the device of FIG. 17 having the fourth region 40 disposed laterally of the second semiconductor region 2 was tested using this arrangement, the device was found to exhibit a breakdown voltage of 121 V, a breakover current of 4 A/cm$^2$ and a maximum surge absorption capacity of 5000 A/cm$^2$. Needless to say, it is also possible to obtain characteristics on a par with these in the case of the embodiment of FIG. 17 which lacks the region 50 within the region 40.

Where it is desired to increase transient noise immunity further so that the device will not respond to a transient noise with large dV/dt, it is advisable to increase the contact area between the second semiconductor region and/or the fourth region and the metallic film, or, as shown in FIG. 23, to form the fourth region 40 of a group of region elements 41, 42, ..., 4n, thus forming between these fourth region elements a plurality of laterally spaced first semiconductor region portions 11, 12, ..., 1n−1, to provide these first semiconductor region portions 11, 12, ..., 1n−1 with a common electrode making ohmic contact therewith so as to constitute a terminal 1t, and to similarly provide the fourth region elements 41, 42, ..., 4n with a common path comprising a terminal 4t.

Although the device provided with the fourth region enables the clamp voltage following surge discharge to be held to a very low level, there are cases, depending on the application to which the device is put, in which it is not necessarily preferable to simply hold the clamp voltage to a low level. The surge absorption device of this type is positioned between the power source for the protected circuit and the load and is connected in parallel with the load. Thus if the clamp voltage following surge discharge should be lower than the voltage of the power source, the device will, once turned on by the occurrence of a surge, continue to maintain the turn-on state, with the result that power source energy will be wastefully consumed. (This is known as the follow-current phenomenon.)

Therefore, while a proper balance also has to be maintained with respect to the aforesaid freedom of design, there are cases where it is most preferable to set the clamp voltage to be higher than, but as close as possible to, the power source voltage of the circuit concerned. This assures that heat generation will be held to the minimum and that the device will be automatically reset following the disappearance of the cause for the surge, without giving rise to follow current.

FIG. 24 shows an embodiment especially devised to exhibit an automatic reset function following the completion of surge discharge.

Although the basic structure of the device of FIG. 24 is the same as that of FIGS. 1 and 8 and has the third region and the fourth region 40 which are formed of a semiconductor, it differs in that it is further provided within the fourth region 40 with a fifth region 50 of a material, e.g. a metal, silicide, or a semiconductor of the opposite conductivity type from that of the fourth region, which forms a junction diode with the fourth region 40, whereby a junction diode of reverse direction to the junction diode between the first and fourth regions is formed between the fourth and fifth regions.

As shown in FIG. 24, a first semiconductor region 1 has on its top surface a second semiconductor region 2 and a third region 3, both formed by double diffusion, and has on its back surface with a fourth region 40. In the illustrated example, as a first semiconductor region 1 of n-type has been chosen, the second semiconductor region 2 is made p-type by the diffusion of an appropriate impurity such as boron, while the fourth region 4 is also made a p-type semiconductor region. Therefore, the fifth region is given n-type conductivity so as to form a junction diode with the fourth region 40 on the side thereof opposite from the first semiconductor region 1. As the third region 3 of this embodiment constitutes one end of the main current path at the time of punch-through it should preferably have high conductivity. It is therefore formed to have a high impurity concentration, i.e. it is formed as p$^+$-type region and an n$^+$-type region by double diffusion of impurity. The formation of terminals on the device is by the same method as described regarding earlier embodiments.

Explanation of the operation of this device will now be made with respect to the case that the terminals 2t and 3t are electrically short-circuited by line Ls, and the surge voltage is applied between these two terminals on the one side and a terminal 5t provided on the fifth region 50.

In the surge absorption device 10 of this type, when a reverse bias is applied across the pn junction between the first semiconductor region 1 and the second semiconductor region 2, the resulting depletion layer is not only present at the first semiconductor region 1 but also extends toward the third region 3.

Therefore, when a surge voltage comes to be applied between the terminals 2t, 3t on one side and the terminal 5t on the other, since the surge voltage is applied in the phase of a reverse bias across said pn junction and is of large magnitude, it is possible for the upper edge of the depletion layer to reach the third region 3.

Figure 25:
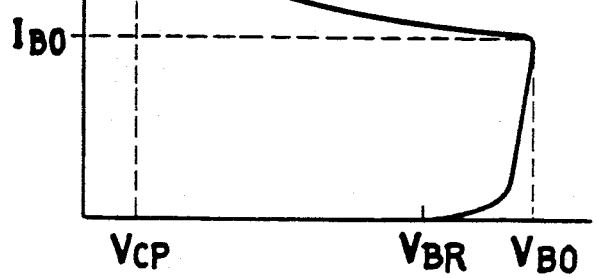
FIG. 25 is a graph showing the characteristic curves of the operating voltage and current for the device of FIG. 22.

This state is tantamount to a punch-through state between the first semiconductor region 1 and the third region 3 and is a state of low impedance permitting the flow of a large current, meaning that it is the beginning of the breakdown state of the present surge absorption device. In FIG. 25 this beginning point is indicated on the voltage axis as the breakdown voltage.

Once this initial breakdown state occurs, surge current starts to flow between the terminals 2t, 3t and 5t, holes are injected into the first semiconductor region 1 from the fourth region 40, and the injected holes collect in the second semiconductor region 2, from where they pass through the terminal as external current (device current).

Therefore, when the product of this current and the resistance of the second semiconductor region 2 sandwiched between the third region 3 and the first semiconductor region 1 becomes equal to the forward voltage of the pn junction diode formed by the second and third regions 2 and 3, electrons are injected into the second semiconductor region 2 from the third region 3, whereby the current increases, and holes are again injected from the fourth region 40. Thus positive feedback is established.

The current value at which this positive feedback arises is the breakover current mentioned earlier, and the voltage across the device terminals (between the terminal 3t and the terminal 5t) is the breakover voltage.

While, as was mentioned earlier, the breakover voltage $V_{BO}$ is somewhat larger than the breakdown voltage $V_{BR}$, once positive feedback starts, the voltage across the device terminals drops to a very low value whose actual level is approximately equal to the product of the absorbed current and the series resistance of the various portions of the device, plus the forward voltage of the pn junction and the voltage between the regions 40 and 50.

In the device shown in FIG. 25, however, the clamp voltage $V_{CP}$ is equal to the sum of the breakdown voltage of the junction diode between the fourth region 40 and the fifth region 50, and the very low voltage between the third and fourth regions. Therefore, the clamp voltage $V_{CP}$ of this device can be freely determined by appropriately determining the impurity concentration of the fourth region 40.

As will be understood from the aforesaid mechanism, when no surge voltage is acting on the surge absorption device 10 shown in FIG. 25, a preset breakdown voltage is maintained and the amount of current flowing through the device is held to a minimum so that significant power consumption is prevented. On the other hand, once a surge of a voltage exceeding the breakdown voltage comes to act on the device, the device immediately provides a clamp voltage of a level that can be freely selected in advance, so that the large surge current is absorbed and the circuit system connected therewith is reliably protected. Moreover, after the cause for the surge ceases to exist, the device is prevented from unnecessarily maintaining the turn-on state.

Figure 27:
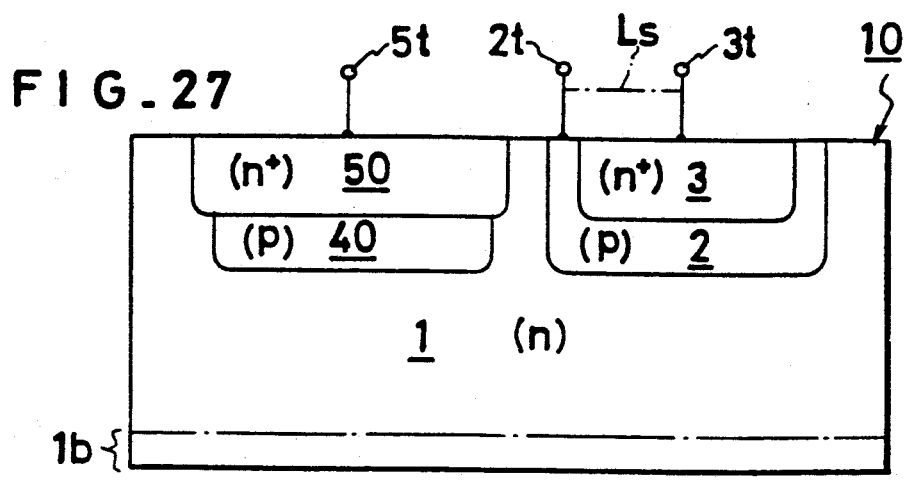
FIG. 27 is a schematic illustration of the structure of a twentieth embodiment according to the invention.

FIGS. 26 and 27 show modifications of the device shown in FIG. 24, wherein the fourth and fifth regions 40 and 50 are provided on the top surface of the substrate in proximity to the second and third regions. The operational effect obtained with these devices is the same as that obtained with the embodiment of FIG. 24. Similarly to the embodiment of FIG. 17, the devices according to these embodiments are also preferably provided on the back surface of the substrate (i.e. the first semiconductor region 1) with a high-concentration impurity layer 1b, which regardless of the conductivity type of the first region 1 may be of either n+-type or p+-type, since the provision of such a layer 1b facilitates efficient carrier transfer.

More specifically, if, as illustrated, the first semiconductor region 1 is of an n-type semiconductor and the conductivity of the high-concentration impurity layer 1b is selected as the n+-type, a type of built-in electric field will be formed by the high-concentration impurity layer 1b and the first semiconductor region 1, whereby, as indicated by the arrow f1 in FIG. 26, holes injected from the fourth region 40 will be turned back in the vicinity of the high-concentration impurity layer 1b so as not to recombine in the back surface of the first semiconductor region 1.

On the other hand, if a high-concentration impurity layer 1b of p+-type is provided on the back surface of an n-type first semiconductor region 1, then, as schematically indicated by the arrows f2a and f2b in FIG. 26, the holes once entering the high-concentration impurity layer 1b will, because of the increased potential of this layer caused by its saturation with holes, be ejected therefrom or, as indicated by the arrow f2c, be repelled thereby, so that in this case too the recombination of holes in the back surface of the first semiconductor region will be prevented.

In the embodiment shown in FIG. 27, the fifth region 50 extends laterally out of the fourth region 40 so as to maintain the uniformity of the breakdown current following the avalanche or Zener breakdown process.

Figure 28:
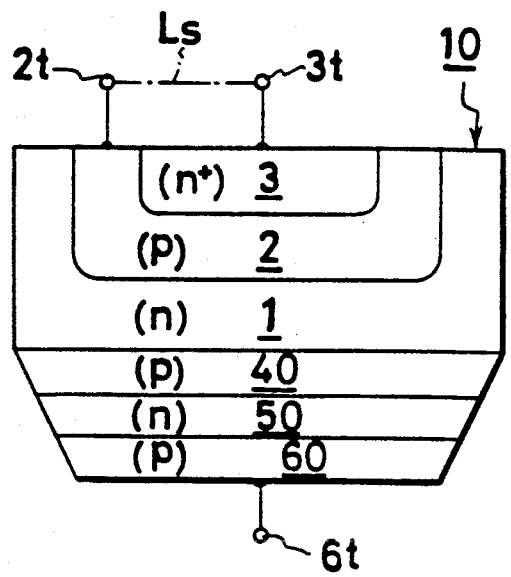
FIG. 28 is a schematic illustration of the structure of a twenty-first embodiment according to the invention.

FIG. 28 shows a device like that of FIG. 24 wherein the sides of the regions 40–60 are formed in the manner of mesas, an arrangement that assures uniform flow of the breakdown current through the junction surfaces. This device is further provided with a sixth region 60 formed of a material capable of forming a junction diode with respect to the fifth region 50 (this material being a p-type semiconductor in the illustrated embodiment), whereby the punch-through voltage of the fifth region becomes that plus the very low voltage between the third and fourth regions. Thus the clamp voltage arising at the time a surge comes to be applied across the terminals 2t, 3t on the one side and the sixth region terminal 6t on the other and the device shifts into the punch-through state according to the aforesaid mechanism can be selected and fixed with a high degree of controllability from within a considerably wide range of values by controlling the impurity concentration and thickness of the fifth region 50.

The sixth region in this embodiment can be formed of a semiconductor or, depending on the conductivity type of the first semiconductor region, of silicide or metal.

Figure 29:
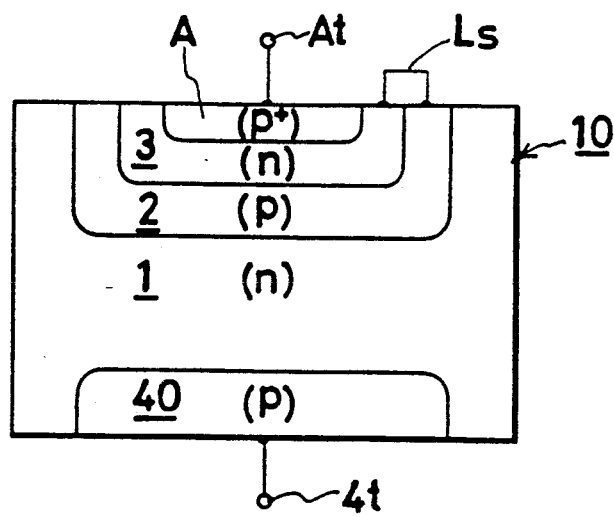
FIG. 29 is a schematic illustration of the structure of a twenty-second embodiment according to the invention.

FIG. 29 shows a device having the basic structure of the device shown in FIG. 24 wherein the third region has formed therein an auxiliary region A consisting of a material capable of forming a junction diode with respect thereto. As the third region is of n-type in this embodiment, the auxiliary region A is of p-type. In this embodiment, the avalanche or zener breakdown voltage between the auxiliary region A and the third region 3 is added to the very low voltage between the third and fourth regions so that the clamp voltage of the device can be freely set by controlling the impurity concentration of the third region 3. This embodiment also assumes the clamped voltage state after discharge caused by the occurrence of punch-through upon the application of surge current across the terminals At and 4t, but is particularly advantageous in that it enables the clamp voltage to be set appropriately for the prevention of follow current. The auxiliary region in this embodiment can be formed of a semiconductor or, depending on the conductivity type of the third region, of silicide or metal.

Figure 30:
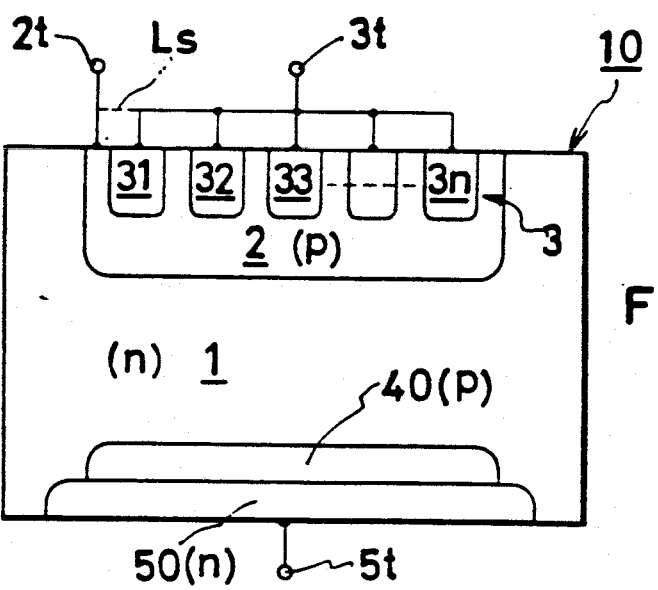
FIG. 30 is a schematic illustration of the structure of a twenty-third embodiment according to the invention.

FIG. 30 shows another modification of the device shown in FIG. 24, wherein the second region 2 formed in the semiconductor substrate, i.e. the first semiconductor region 1, and exhibiting the opposite type of conductivity from the first semiconductor region 1 is formed with a third region 3 constituted of a plurality of third region elements 31, 32, 33, . . . , 3n (n=5 in the illustrated embodiment). From what was explained earlier, it will be understood that this structure makes it possible to avoid electric field concentration and to obtain an even current distribution. As a result, it is also possible to obtain a current capacity that increases approximately in proportion to increasing device surface area.

Figure 31:
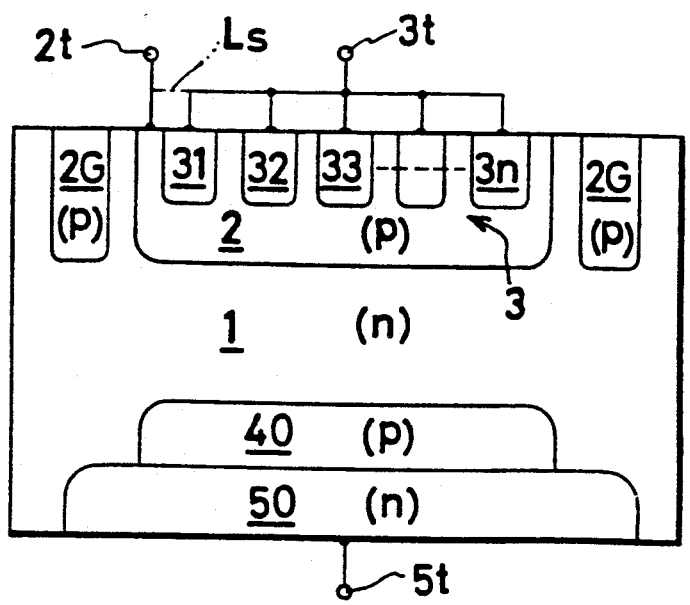
FIG. 31 is a schematic illustration of the structure of a twenty-fourth embodiment according to the invention.

FIG. 31 shows an embodiment provided with the capability of preventing or suppressing avalanche breakdown beginning at the edge or corner junction of the second semiconductor region, whereby it is possible to avoid the danger of deterioration in controllability which occurs when the breakdown voltage approaches the avalanche breakdown voltage between the first and second regions. Similarly to the embodiment of FIG. 5, the second semiconductor region 2 is surrounded with a guard ring region 2G of the same conductivity type as the second semiconductor region 2.

Figure 32:
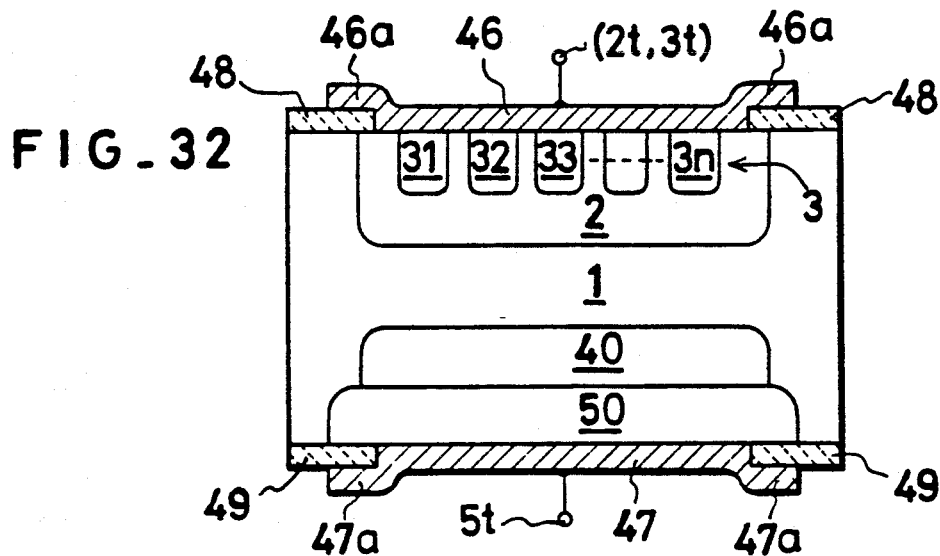
FIG. 32 is a schematic illustration of the structure of a twenty-fifth embodiment according to the invention.

The same effect can also be obtained by applying the means employed in the embodiments of FIG. 6 and FIG. 13; namely, by providing on the surfaces of the second and third regions 2 and 3 a continuous ohmic electrode 46 each edge 46a of which extends over the part of an insulation film 48 provided to straddle the junction between the edge of the second semiconductor region and the first semiconductor region, as shown in FIG. 32.

Thus in the embodiments of FIGS. 31 and 32 it is possible to alleviate the concentration of electric field at the edges of the second semiconductor region and in effect to increase the avalanche voltage, in this way broadening the freedom of design as regards determining the breakdown voltage purely in terms of punch-through as contemplated by the present invention.

Moreover, in the embodiment according to FIG. 32, the surface of the fifth region 50 is provided with a continuous ohmic electrode 47 each edge 47a of which extends over the part of an insulation film 49 provided to straddle the junction between the edge of the fifth region and the fourth region 40. In this case, the fourth region 40 is formed of a semiconductor.

Figure 33:
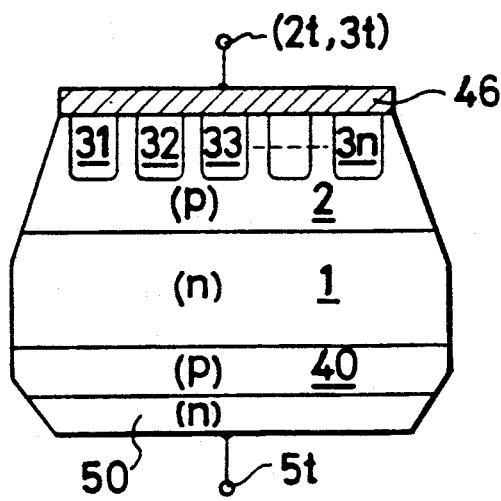
FIG. 33 is a schematic illustration of the structure of a twenty-sixth embodiment according to the invention.

FIG. 33 shows a modified device realized by incorporating the fifth region 50 of the embodiment of FIG. 24 in the embodiment of FIG. 14. More specifically, the portion corresponding to the edge of the junction between the first and second semiconductor regions is subjected to etching or cutting processing either perpendicularly to the surface or along a plane inclined at an angle thereto. The same type of processing can also advantageously be carried out with respect to the fourth region 40 and the fifth region 50. In using such a simple expedient as this, however, it is generally necessary to provide the cut surface with an appropriate protective film (not shown).

Figure 34:
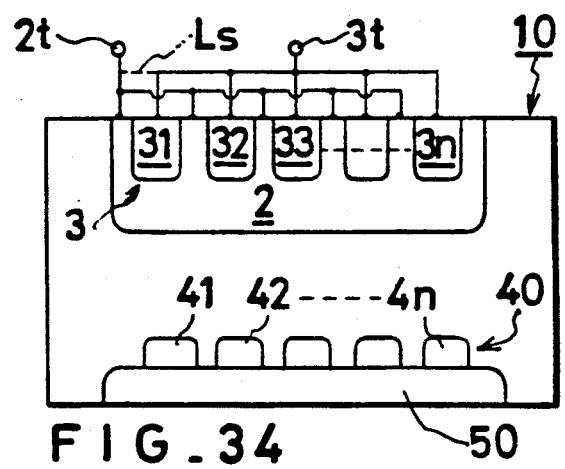
FIG. 34 is a schematic illustration of the structure of a twenty-seventh embodiment according to the invention.

Further, in order to increase the uniformity of the current which flows through the junction and determines the clamp voltage, it is possible, as shown in FIG. 34, to constitute the fourth region as a plurality of region elements 41, 42, . . . , 4n as shown in FIG. 34. Such a subdivided structure may likewise be applied to the embodiments shown in FIGS. 24 and 26.

The embodiments illustrated in FIGS. 24–34 have the capability of preventing follow current from arising. By way of example, there will be explained the process by which the inventors experimentally fabricated one of these devices, namely the device according to the embodiment of FIG. 30, as well as the performance exhibited by the fabricated device.

As the starting material for the first semiconductor region 1 there was used a 300 μm-thick silicon wafer exhibiting a resistivity of 5 Ω-cm, n-type conductivity, and a (111) surface. As the first step, a 6000 Å SiO$_2$ film was formed on the front and back surfaces of the wafer. The SiO$_2$ film was then removed from only the back surface and phosphorous was diffused into the wafer at a high concentration to a depth of 3 μm. Then, in order to define the two-dimensional configuration of the second semiconductor region 2, the SiO$_2$ film on the front surface was subjected to photoetching in accordance with a prescribed pattern so as to produce an impurity diffusion window. Boron was diffused through the diffusion window to form a p-type region to a depth of 2.5 μm. Next, in order to define the two-dimensional configuration of a plurality of third region elements 3l–3n, another SiO$_2$ film was formed on the front surface of the wafer and this film was then subjected to photoetching in accordance with a prescribed pattern so as to produce a plurality of impurity diffusion windows for formation of a plurality of third region elements.

Phosphorus was diffused through these windows at high concentration, whereby the third region 3 was formed as a group of n$^+$-type third elements 3l–3n of a depth of 1.2 μm. As a result, a second semiconductor region 2 having an effective depth Dt of 1.3 μm was simultaneously produced.

The back surface of the n-type semiconductor substrate was then diffused with impurity to form a p$^+$-type fourth region, followed by impurity diffusion for the formation of an n$^+$-type fifth semiconductor region 50. Finally an electrode or terminal 5t was formed on the fifth region by vacuum deposition of a metallic film.

The resulting surge absorption device exhibited a breakdown voltage of 121 V, a breakover current of 4 A/cm$^2$, and a surprisingly large maximum surge current absorption capacity of 5000 A/cm$^2$.

Moreover, the clamp voltage could be freely controlled to any desired value between 5 and 50 V.

From these characteristics it will be appreciated that the fourth region 40 and the fifth semiconductor region 50 provided in accordance with this invention produce an extremely large effect.

Additional surge absorption devices were fabricated under identical conditions to those mentioned above except that at the time of forming the n$^+$-type third region, which substantially determines the effective thickness of the second semiconductor region 2, the diffusion time was varied from device to device. As a result, it was possible to fabricate devices having breakdown voltages ranging from 30 V to 170 V. Moreover, this is by no means the largest range over which the breakdown voltage can be varied. It was confirmed that by further adjusting other fabrication conditions it is possible to vary the breakdown voltage over a range extending from several volts up to several hundred volts.

It is further worth noting that in the device shown in FIG. 29, if the fourth region 40 is modified into a laminated region consisting of second and third regions 2 and 3 plus an auxiliary region A, then, on condition that the impurity concentration of the third region is controlled vis-a-vis the auxiliary region so as to determine the breakdown voltage at an appropriate level for obtaining an appropriate clamp voltage, it will be possible to obtain the effect of this invention with respect to surges of either polarity.

FIG. 35 shows an embodiment of the surge absorption device according to this invention which enables the clamp voltage during surge current discharge to be lowered and, moreover, which, when the holding current for maintaining the turn-on state is set higher than the normal level of the current supplied by the power source of the system to be protected, is capable of automatically turning itself off (i.e. resetting itself) after the completion of surge current discharge. As shown in the drawing, the device is provided on the front surface of the first semiconductor region 1 at a position between the second semiconductor region 2 and the fourth region 40 and/or on the back surface of the same and/or on the back surface of the first semiconductor beneath said second semiconductor region or fourth region with a carrier recombination region 70 formed by introducing lattice defects by abrasion or by the provision of a Schottky junction. And as an alternative method of producing the region there can be used one involving the diffusion of iron or of gold or some other heavy metal. The mechanism by which the carrier recombination region or regions make it possible to control the holding current will now be explained.

Assume that minority carriers are injected into the first semiconductor region 1 from the fourth region 40 as indicated by the arrows f1, f2a and f2b. The minority carriers passing along the path indicated by the arrow f1 enter the second semiconductor region 2, while those moving along the paths indicated by the arrows f2a and f2b are caught by the carrier recombination region or regions 70 on the front and/or back surfaces, and annihilated by recombination. Therefore, so long as the number of injected minority carriers from the fourth region 4 is small, it is only the current passing along path f1 that effectively acts to hold the device in turn-on state. On the other hand, as the amount of injected current from the fourth region grows larger it eventually exceeds the rate at which carriers can be recombined in the carrier recombination region or regions 70 on the back and/or front surfaces of the substrate so that minority carriers start to flow through and around the recombination regions and pass into the second semiconductor region 2. As a result the device is turned on. The thus controlled holding current can therefore be determined as desired at the device design stage by controlling the position and area of the carrier recombination regions, the depth thereof, the number of lattice defects introduced or the concentration of diffused heavy metal.

Figure 36:
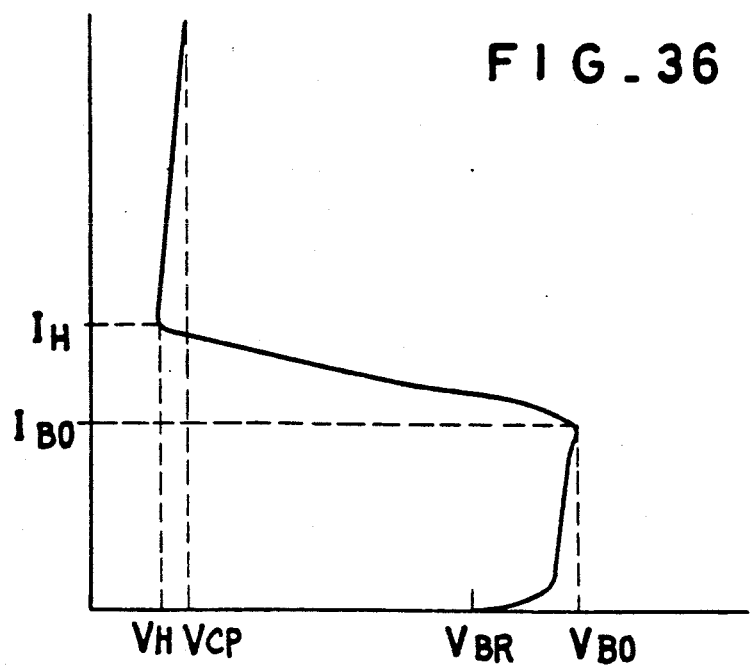
FIG. 36 is a graph showing the characteristic curves of the operating voltage and current for the device of FIG. 35.

The voltage-current characteristics of the aforesaid device are shown in FIG. 36, from which it will be understood that in this device it is possible to prevent the flow of follow current and realize automatic resetting if the holding current $I_H$ for maintaining the turn-on state of the device is set over a level higher than the current supplied from the power source in the normal state.

FIG. 37 shows a modified device obtained by incorporating the carrier recombination region 70 in the device according to FIG. 18. In this device, the second region 2 is formed on the front surface of the first semiconductor region 1 and the third region 3 is formed within the second region 2 as a plurality of third region elements 31-3n. The fourth region 40 is formed on the same surface spaced apart laterally from the second and third regions 2 and 3, while a carrier recombination region 70 of the aforesaid type is formed on at least one of the front and back surfaces of the substrate. With this structure, the device provides the effects previously explained with respect to the device of FIG. 18 as well as the effects of the carrier recombination region.

FIG. 38 shows a modified device obtained by incorporating the carrier recombination region 70 in the device according to FIG. 19. In this device, a carrier recombination region 70 is formed on the front surface of the substrate between the second region 2 surrounded by a guard ring region 2G and the fourth region 40 surrounded by a guard ring region 4G and/or on the back surface thereof.

Figure 20:
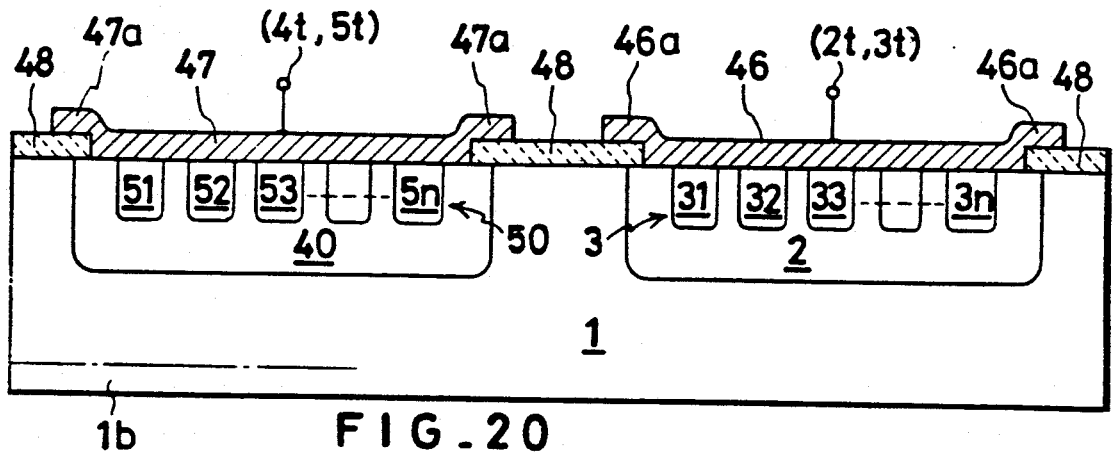
FIG. 20 is a schematic illustration of the structure of a fifteenth embodiment according to the invention.
Figure 39:
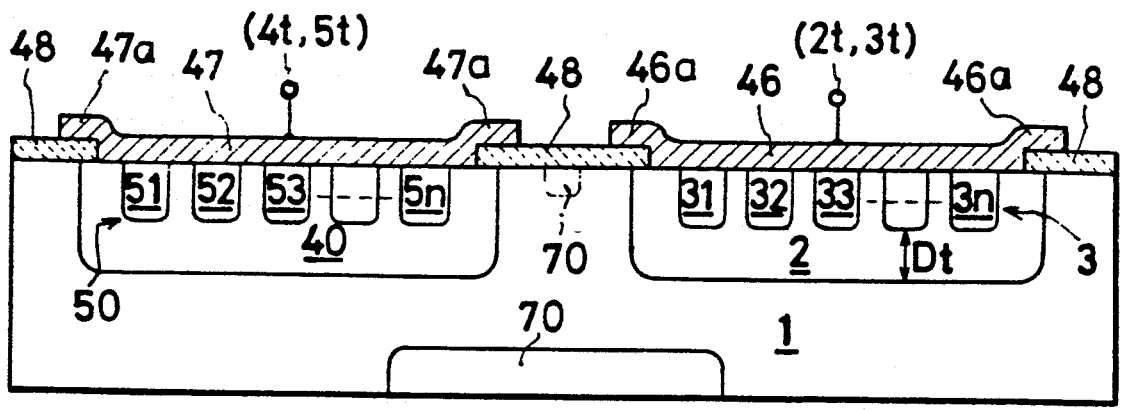
FIG. 39 is a schematic illustration of the structure of a thirty-first embodiment according to the invention.

FIG. 39 shows a modified device obtained by incorporating the carrier recombination region 70 in the device according to FIG. 20. In this device, a carrier recombination region 70 is formed on the front surface of the substrate between the second region 2 and the fourth region 40 and/or on the back surface thereof. With this structure, the device provides the effects previously explained with respect to the device of FIG. 20 as well as the effects of the carrier recombination region. More specifically, the device is capable of discharging surge voltages of either polarity and enables the holding current to be independently set for either polarity by shifting the carrier recombination region 70 either toward the second region 2 or toward the fourth region 40.

Figure 40:
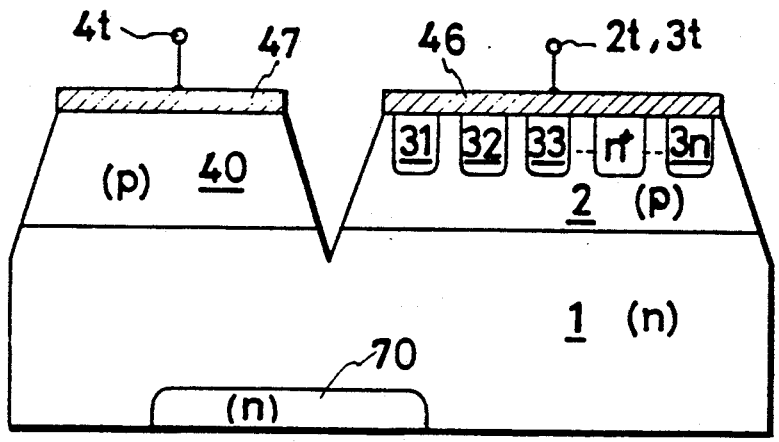
FIG. 40 is a schematic illustration of the structure of a thirty-second embodiment according to the invention.

FIG. 40 shows a modified device obtained by providing the carrier recombination region 70 on the back surface of the substrate of the device according to FIG. 21, whereby the device is further provided with the effects of the carrier recombination region 70.

Figure 41:
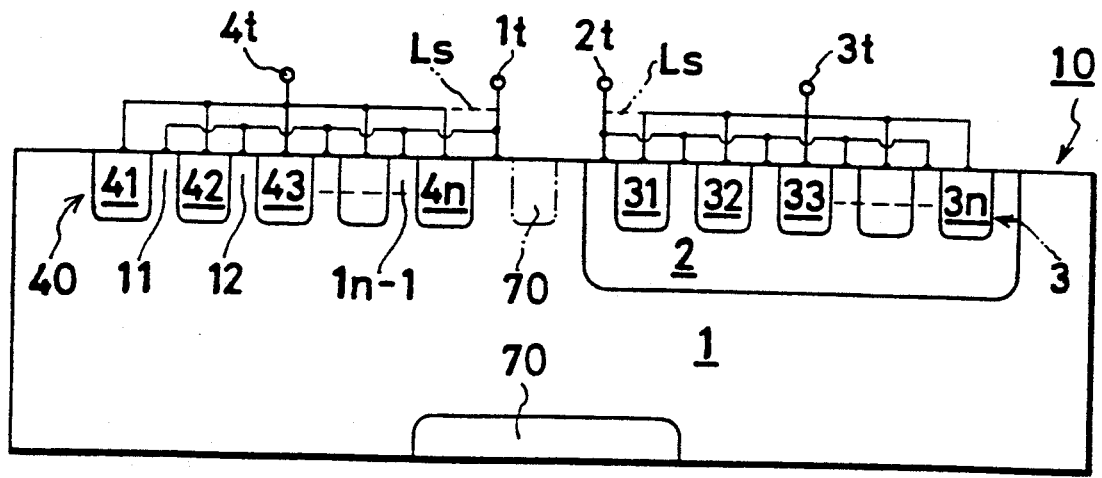
FIG. 41 is a schematic illustration of the structure of a thirty-third embodiment according to the invention.

FIG. 41 shows a modified device obtained by incorporating the carrier recombination region 70 in the device according to FIG. 23. In this device, a carrier recombination region 70 is formed on one or both of the front and back surfaces of the substrate. With this structure, the device provides the effects previously explained with respect to the device of FIG. 23 as well as the effects of the carrier recombination region.

From the foregoing it will be clear that the carrier recombination structure used in the embodiments according to FIGS. 35 to 41 can of course also be incorporated into the embodiment of FIG. 22 as well as into other device structures inferrable from the aforesaid examples.

The effect of this carrier recombination region was confirmed by experiments, one of which will be described in the following by way of example. The experiment in question was carried out with respect to a device of a structure like that shown in FIG. 39 fabricated using a 300-$\mu$m silicon wafer (the first semiconductor region 1) exhibiting a resistivity of 5 $\Omega$-cm, n-type conductivity and a (111) surface. The top surface of this wafer was diffused with boron to form a second region 2 measuring 2.5 $\mu$m in depth and 200 $\mu$m in width, and a fourth region 40 spaced 70 $\mu$m from the second region 2 and having the same dimensions as the second region. Thereafter, by the diffusion of phosphorus to a depth of 1.2 $\mu$m, the second region 2 was formed with a plurality of n$^+$-type region elements 31-3n constituting a third region 3 and the fourth region 40 was formed with a plurality of n$^+$-type region elements 51-5n constituting a fifth region 50. As a result the effective thickness Dt of the second region 2 of the device became 1.3 $\mu$m. Alumina powder was then sprayed on the back surface of the device, whereafter the resulting alumina layer was abraded to form a carrier recombination region 70. The resulting device was tested in comparison with another identical in all respects except that it did not have the carrier recombination region 70. The holding current $I_H$ of the device with the carrier recombination region was 0.3 A while that of the one without this region was only 10 mA. From this it is clear that the carrier recombination region has the effect of increasing the holding current to a large value.

In the case of the embodiment shown in FIG. 35, as was explained earlier, the second semiconductor region 2 and the third region 3 are formed in the semiconductor region 1 as a substrate by double diffusion. Therefore, it is possible in such case to directly control the effective depth Dt of the second semiconductor region 2 by, after the formation of second semiconductor region 2, controlling the diffusion depth Dd of the impurity for the formation of the third region. In other words, when double diffusion is used, change or modification in the depth of the third region 3 within the first semiconductor region 1 directly determines the effective thickness Dt of the second semiconductor region 2.

On the other hand, in the case where the second semiconductor region 2 and the third region 3 are formed by epitaxial growth, the effective thickness Dt of the second semiconductor region 2 is in general determined by the thickness of the grown film itself as a function of the various conditions in epitaxy, but this does not change the fact that as an actual practical matter it is the presence of the third region 3 which determines the effective thickness Dt.

The effective thickness Dt of the second semiconductor region 2 can be controlled with high precision using conventional technology regardless of whether this region is formed by a diffusion method or an epitaxial method. This means that the breakdown voltage of this device can be controlled with high precision.

Moreover, the impurity concentration of the second semiconductor region 2, which is another factor in determining the punch-through voltage and accordingly the breakdown voltage of the device, can also be adjusted and controlled with high precision using conventional technology.

This means that in designing the device according to this invention the breakdown voltage can be determined on the basis of two independent variables both of which can be varied precisely over wide ranges, namely, the effective thickness of the second semiconductor region 2 and the impurity concentration thereof. Therefore, by using only one or the other of these two variables or by using both in appropriately controlled relation, it is possible not only to vary the breakdown voltage over a wide range of values but also to determine such other electrical characteristics as the junction capacitance and series resistance independently of breakdown voltage.

Needless to say, the fourth region 4 can also be formed with excellent controllability using any of various conventional methods such as impurity diffusion and epitaxy. Also, in the surge absorption device shown in FIGS. 35, 37, 40 and 41 the fourth region 40 need only be formed of a material which forms an injection junction capable of injecting minority carriers into the first semiconductor region 1. It is therefore not limited to a semiconductor of opposite conductivity type from the first semiconductor region as used in the illustrated embodiments but may instead be of silicide or, in the case where the first semiconductor region 1 is of p-type, may be of a metal capable of injecting electrons. It should also be noted that the third region 3 need not be formed of semiconductor either, but may be of silicide, metal or any other material capable of injecting minority carriers into the second semiconductor region 2.

As has been explained in the foregoing, in accordance with the present invention it is possible to fabricate surge absorption devices exhibiting different breakdown voltages starting with wafers having the same material constants. Moreover, since the second semiconductor region together with the third region, the fourth region together with the fifth region, or the second semiconductor region together with the third region formed of a semiconductor in this case and the auxiliary region can be formed at one time from the same surface of the first semiconductor region, the control for setting or modifying the breakdown voltage and the clamp voltage can be carried out with great ease and high precision.

Moreover, the other electrical properties such as the junction capacitance and series resistance can be determined independently of the breakdown voltage and clamp voltage so that, for example, devices with different breakdown and/or clamp voltages can be fabricated to have substantially identical electrical properties in other respects.

The invention also makes it possible to integrate a plurality of devices in a single semiconductor wafer or chip.

As the principle of the surge absorption device according to this invention is such that the device can be designed to have a clamp voltage which is smaller than the breakdown voltage in the large current region, devices having very large surge current absorption capacity can be fabricated, assuring very high and reliable protection for the protected circuit.

While it is a feature of the invention that the clamp voltage can be greatly reduced, it is nevertheless possible to design the device so as not to have an excessively low clamp voltage or so as to have a clamp voltage matched to the voltage of the power source with which the device is to be used. Therefore, it is possible to prevent the occurrence of follow current, i.e. the continuous flow of current through the device even after the cause for the surge ceases to exist.

Further, in the case where the second region and the fourth region are provided side by side on the same surface of the substrate 1, if a carrier recombination region is formed at least on the front surface of the substrate between the second and fourth regions or on the back surface of the substrate, it is possible to greatly reduce the clamp voltage and to set the holding current at a large value, whereby the device will automatically reset following the disappearance of surge current, thus avoiding the flow of follow current.

Among the many other advantageous effects obtainable by the surge absorption device according to this invention is the fact that the device can be designed to handle surge currents of either polarity.

What is claimed is:

1. A surge absorption device comprising:
 a first semiconductor region having a first surface portion and exhibiting conductivity of one type;
 a second semiconductor region formed in contact with said first surface portion of said first region and exhibiting conductivity of the type opposite to that of said first region to form a first pn junction between itself and said first region;
 at least one third region formed in contact with said second region so as to determine the effective thickness of said second region which correspond to the distance between said first region and at least one third region;
 at least one fourth semiconductor region formed in contact with said first region, spaced apart from said second region and forming a second pn junction between itself and said first region for causing minority carriers of a kind the same as that of minority carriers in said first region to be injected therethrough into said first region when a depletion layer formed by application of reverse bias across said first pn junction has reached said at least one third region to form a punch-through region in said second region;

a fifth semiconductor region provided with a first ohmic electrode, formed in contact with said at least one fourth region to form a third pn junction between itself and said at least one fourth region, said fifth region also formed in contact with said first region; and said at least one third region being also one capable of injection minority carriers of a kind the same as that of minority carriers in said second region into said second region after the formation of said punch-through region.

2. A surge absorption device according to claim 1, further comprising a second ohmic electrode in contact with said second semiconductor region and at least one third region.

* * * * *